United States Patent

Fujiwara

(10) Patent No.: US 7,129,526 B2
(45) Date of Patent: Oct. 31, 2006

(54) WHITE COLOR LIGHT EMITTING DEVICE

(75) Inventor: Shinsuke Fujiwara, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 11/018,740

(22) Filed: Dec. 20, 2004

(65) Prior Publication Data

US 2005/0110034 A1   May 26, 2005

Related U.S. Application Data

(62) Division of application No. 10/430,006, filed on May 6, 2003, now Pat. No. 6,858,869.

(30) Foreign Application Priority Data

| May 15, 2002 | (JP) | ............................. 2002-139865 |
| May 28, 2002 | (JP) | ............................. 2002-153447 |
| Feb. 20, 2003 | (JP) | ............................. 2003-420030 |

(51) Int. Cl.
*H01L 33/00* (2006.01)
*H01L 29/22* (2006.01)

(52) U.S. Cl. .................... 257/94; 257/89; 257/102; 257/103; 257/E33.026; 313/501; 313/502; 313/503; 313/504

(58) Field of Classification Search .............. 257/81, 257/98, 100, 94, 89, 102–103, E33.026; 313/501–504
See application file for complete search history.

(56) References Cited

U.S. PATENT DOCUMENTS

| 6,337,536 B1 | 1/2002 | Matsubara et al. |
| 6,724,018 B1 | 4/2004 | Ando et al. |
| 6,858,869 B1 * | 2/2005 | Fujiwara ..................... 257/79 |

FOREIGN PATENT DOCUMENTS

| JP | 55-1003 | * | 1/1980 |
| JP | 2000-82845 | | 3/2000 |
| JP | 2000-261034 | | 9/2000 |

* cited by examiner

*Primary Examiner*—Jerome Jackson
*Assistant Examiner*—Joseph Nguyen
(74) *Attorney, Agent, or Firm*—Fish & Richardson P.C.

(57) ABSTRACT

An ultraviolet type white color light emitting device (Q) including a 340 nm–400 nm ultraviolet InGaN-LED, a first fluorescence plate of ZnS doped with more than $1\times10^{17} cm^{-3}$ Al, In, Ga, Cl, Br or I for absorbing ultraviolet rays and producing blue light (fluorescence), a second fluorescence plate of ZnSSe or ZnSe doped with more than $1\times10^{17} cm^{-3}$ Al, In, Ga, Cl, Br or I for absorbing the blue light, producing yellow light (fluorescence) and synthesizing white color light by mixing the yellow light with the blue light.

A blue light type white color light emitting device (R) including a 410 nm–470 nm blue light InGaN-LED, a fluorescence plate of $ZnS_xSe_{1-x}$ (untreated $0.2 \leq x \leq 0.6$; heat-treated $0.3 \leq x \leq 0.67$) doped with more than $1\times10^{17} cm^{-3}$ Al, In, Ga, Cl, Br or I for absorbing the blue light, producing 568 nm–580 nm yellow light (fluorescence) and synthesizing white color light by mixing the yellow light with the blue LED light.

4 Claims, 9 Drawing Sheets

EMBODIMENT ultraviolet type white color light emitting device Q

GaN-type white color light source device A

ZnSe-type white color light source device B

Fig.4  EMBODIMENT ultraviolet type white color light emitting device Q chemical vapor transport method

Fig.6
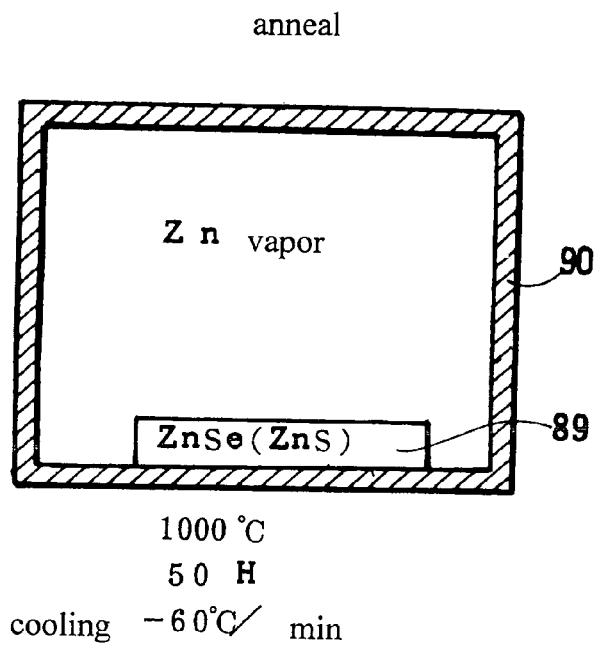
anneal
1000 °C
50 H
cooling −60°C/min
Fig.7 ultraviolet type white color light emitting device Q
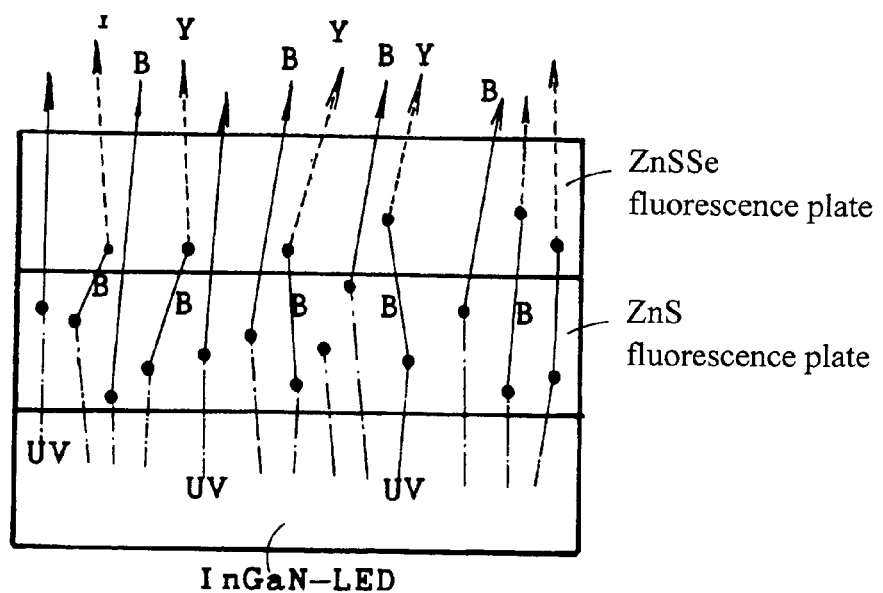

Fig.8
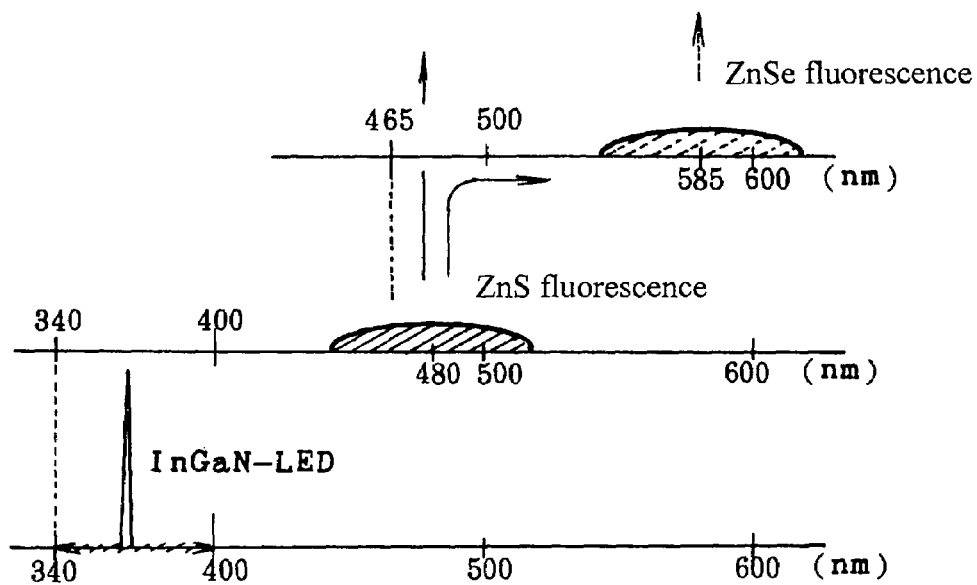
Fig.9       relative emission spectrum
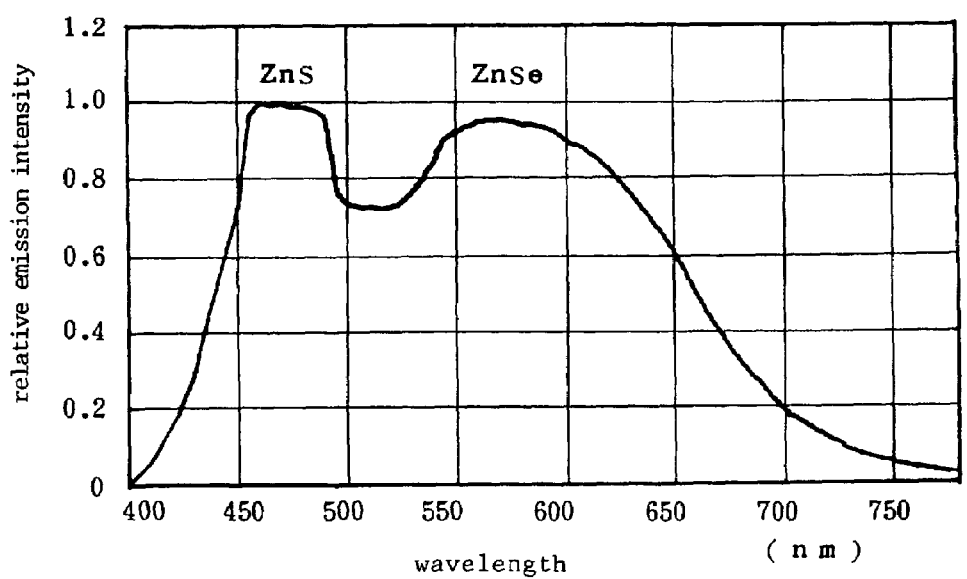

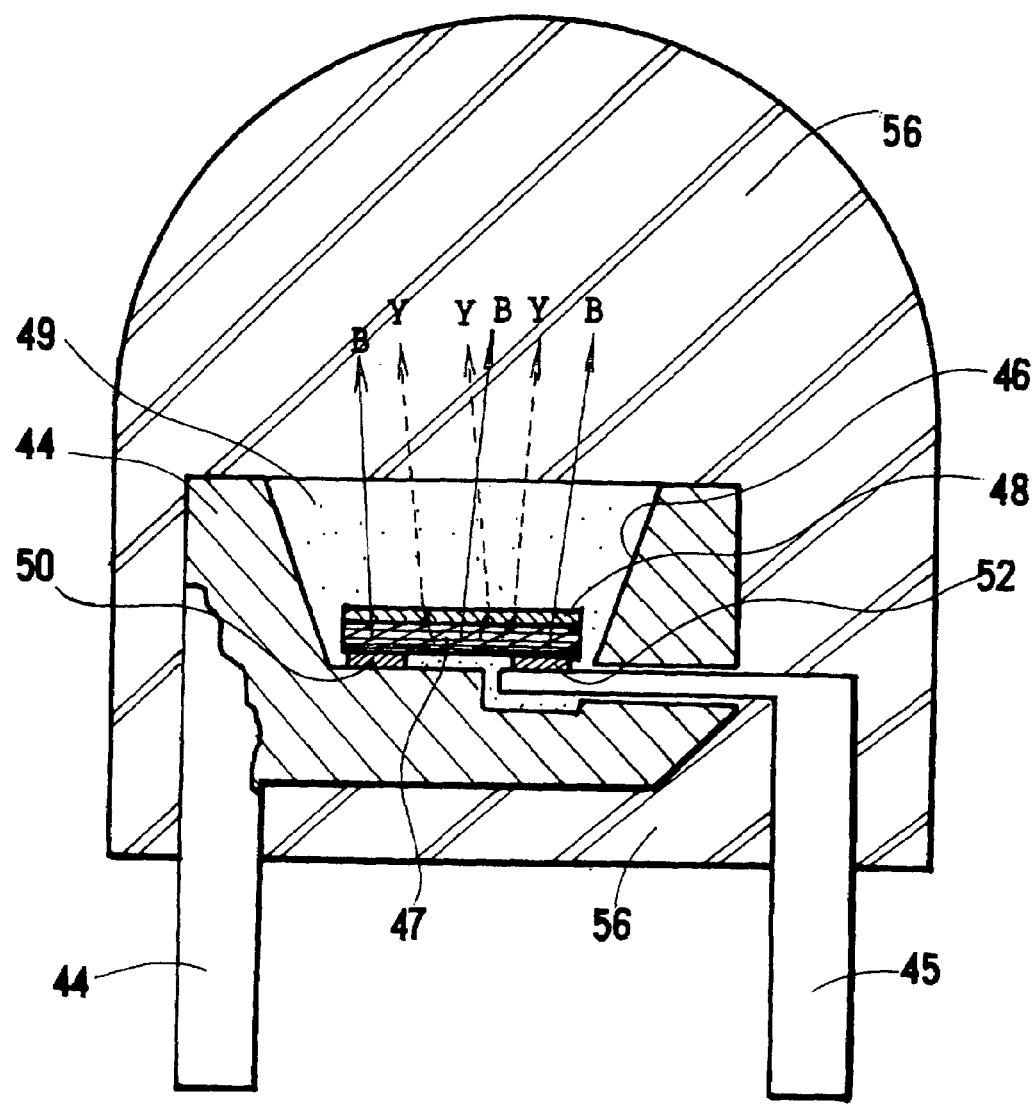
Fig.10 EMBODIMENT
blue type white color light emitting device R

Fig.11 blue type white color light emitting device R
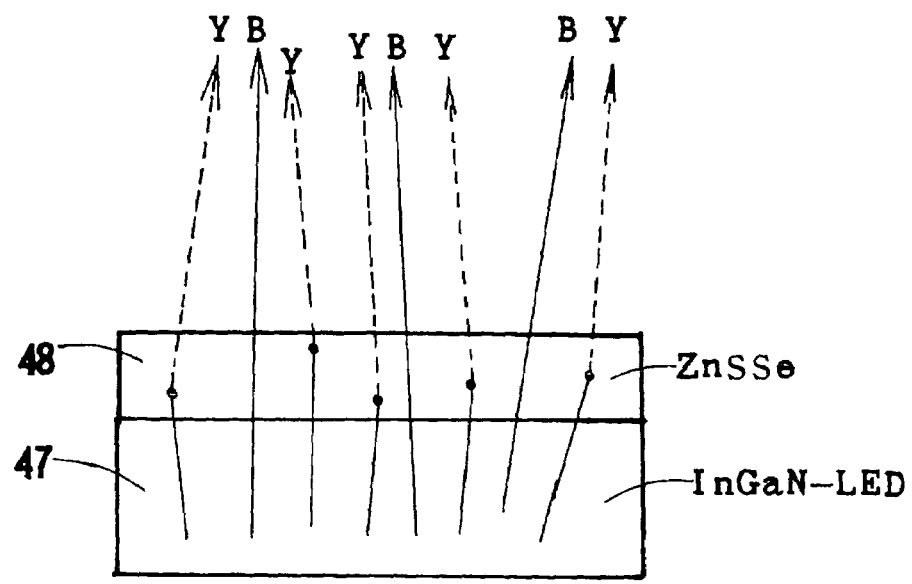

US 7,129,526 B2

WHITE COLOR LIGHT EMITTING DEVICE

CROSS REFERENCE TO RELATED APPLICATIONS

This application is a divisional of U.S. Ser. No. 10/430,006, filed on May 6, 2003, now U.S. Pat. No. 6,858,869 which claims the priority of Japanese Patent Application Nos. (1) 2002-139865, filed on May 15, 2002, (2) 2002-153447, filed on May 28, 2002, and (3) 2003-420030, filed on Feb. 20, 2003. The disclosures of the foregoing applications are incorporated by reference herein.

BACKGROUND OF THE INVENTION

1. Field of the Invention

This invention relates to a simple, light, small, long-life, high color rendering property white color light emitting device which is suitable for lighting, displaying and liquid crystal backlighting.

2. Background

Plenty of light emitting diodes (LEDs) and laser diodes (LDs) have been widely produced and sold on the market as small, long-life, inexpensive light emitting devices. High luminescence light emitting diodes (LEDs) have been already obtained for red, yellow, green and blue. Red light emitting diodes (LEDs) are LEDs having AlGaAs active layers or GaAsP active layers. The active layer means a thin layer which produces and emits light. Energy of emitted light is equal to the bandgap of an active layer. Color of emitted light depends upon the bandgap of the active layer. Yellow and green light can be produced by GaP-LEDs having GaP active layers. Orange/yellow light can be yielded by LEDs having AlGaInP active layers.

Production of blue light which requires a wide bandgap material had been one of the difficult problems. SiC (silicon carbide) type LEDs, ZnSe (zinc selenide) type LEDs and GaN (gallium nitride) type LEDs which had wide bandgap active layers had competed with each other for accomplishing practical, high luminescent, long lifetime blue light LEDs for a while. High-luminescence and long lifetime had allowed the GaN type LEDs to win a victory in the blue light LED race. Gallium nitride type light emitting diodes (GaN-LEDs) have an indium gallium nitride (InGaN) active layer. InGaN is a mixture crystal of InN (indium nitride) and GaN (gallium nitride). A mixture rate x, which means the ratio of components, is omitted here. The GaN type LEDs are denoted by InGaN-LEDs or GaN-LEDs hereafter. The InGaN-LEDs are made upon sapphire substrates ($Al_2O_3$). All the light emitting diodes (LEDs) or laser diodes (LDs) which produce light by electron bandgap transitions emit light of a single color whose energy is equal to the bandgap of the active layer. Monochromatic emission is one of the excellent features of semiconductor light emitting devices (LEDs & LDs) which make use of the bandgap transitions. Semiconductor light emitting devices (LEDs & LDs) are inherently monochromatic light sources. Monochromacity, however, forbids semiconductor devices from generating light including a plurality of colors. No single semiconductor light emitting device can yield complex color light.

DESCRIPTION OF RELATED ART

Monochromatic light sources are useless as illuminating light source. Monochromatic light sources are unsuitable for a liquid crystal backlight for display. Illumination requires white color light sources, in particular, white light sources of high color rendering properties. Liquid crystal backlight, which should generate full colors, also requires white color light sources of high color rendering properties. At present, incandescent light bulbs or fluorescence tubes have been still used as illuminating light sources prevalently. Incandescent light bulbs are favorable for illuminating sources due to high color rendering properties. But incandescent light bulbs have drawbacks of a short lifetime, low efficiency and big volume. Fluorescence tubes have weak points of a short lifetime, heavy weight and large bulk.

White color light sources of a small size, long lifetime, high efficiency and low-cost are desired for illuminating, liquid crystal backlighting and displaying light sources. Nothing else than semiconductor devices can satisfy difficult requirements of a light weight, small size, long lifetime and high efficiency.

At present, blue light LEDs, green light LEDs and red light LEDs are sold on the market. Three elementary color LEDs are available. An assembly of blue, green and red color LEDs mounted on a common panel will be a compound white color light source. The three elementary color mixing LEDs have already been proposed and partly put into practice. However, such a compound white color LED has drawbacks. Since the three types of LEDs emit different colors (G,R,B), the LEDs should be densely populated on the common panel for making white. If the different color LEDs were sparsely dispersed, human eyes discern three kind individual colors instead of white.

The three types of LEDs have different properties of currents, voltages and emission efficiencies, which requires three different electric power sources. Luminosity of three kind LEDs should be balanced for making desired white. In addition, an array of many sets of three kind LEDs at high density enhances cost.

No high cost light sources pervades. Expensive white light sources are useless. Low cost and small sized white color light sources should be produced as semiconductor devices. Instead of assembling three different LEDs, a simpler structure containing a single LED is required for making low cost devices. Prior art of single LED devices is described. One is a complex LED which includes an on-sapphire blue light InGaN-LED and a YAG(yttrium aluminum garnet) fluorescence material enclosing the InGaN-LED. The InGaN-LED makes blue light. The YAG material fluoresces yellow light by being irradiated by the InGaN-LED blue light. Blue light and yellow light synthesize white light. This known device is simply called a GaN-type white color light source device (A).

The other is a blue light ZnSe-LED having an n-type ZnSe substrate doped with a special impurity and an ZnCdSe active layer grown above the substrate. The impurity-doped ZnSe substrate acts as a kind of fluorescence material which induces an SA (self-associated) emission by the blue light of the ZnSe-active layer (ZnCdSe). Yellow light omitted from the AnSe substrate and blue light induced from the ZnCdSe layer synthesize white light. This known device is called a ZnSe-type white color light source device (B). (A) and (B) are described in detail.

(A-Type) GaN-Type White Color Light Source Device (YAG+ InGaN-LED; FIG. 1)

GaN-type device (A) was proposed by,

① "White Color Light Emitting Device", Edited by the Committee of Manual of Photoactive Materials, Optoelectronics Corporation, p457, June 1997

FIG. 1 shows the structure of the proposed the white color device (A).

A Γ-shaped lead 2 includes a horizontal top part which has a cavity 3. An InGaN-LED 4 is epi-up fixed at an bottom of the cavity 3. A resin 5 including a Ce doped YAG fluorescent material is supplied to the cavity 3. The YAG fluorescent material has a role of absorbing blue light and emitting yellow light of lower energy with a broad spectrum. The lower energy light produced by electrons in a special material which absorb higher energy light, make electrons jump from a ground level to an upper excitation level, thermally force electrons drop down to a lower excitation level and to fall electrons to the ground level with a delay time, is called "fluorescence". The materials yielding fluorescence are called fluorescent material. Excited electrons return back to the ground state via a variety of excitation levels. Fluorescence has a wide spectrum containing a plurality of colors. Loss of energy which is a difference between the incidence light energy and the fluorescence energy is converted to heat.

Top electrodes 6 and 7 of the InGaN-LED 4 are joined to the lead 2 and a lead 10 by wires 8 and 9. Upper parts of the leads 2 and 10 and the fluorescent region 5 are encapsulated by a transparent resin 20. A dome-shaped white light emitting device is obtained. The InGaN-LED is built upon an insulating sapphire substrate which prohibits the LED from forming a cathode (n-electrode) on the bottom. Both cathode (n-electrode) and anode (p-electrode) are fabricated upon the top of the LED. Two top electrode requires two wires and a wide area per chip.

The GaN type white color device (A) obtains white light (W) by encapsulating a blue light InGaN-LED with a YAG-dispersed transparent resin 5, making blue light (B) by the InGaN LED, producing yellow fluorescence (Y) by the YAG excited by blue rays and synthesizing blue light with yellow light (W=B+Y). The YAG is doped with Ce. The InGaN-LED emits blue light of a 460 nm wavelength. The YAG fluoresces yellow light having a broad peak of a central wavelength of 570 nm. Namely the Ce-doped YAG converts 460 nm blue light into broad 570 nm peaked yellow light.

The on-sapphire InGaN LED has advantages of high luminosity and a long lifetime. The GaN-type white color device has also an advantage of a long lifetime. The YAG is an opaque fluorescent material. This is a weak point of (A), since absorption of blue light by the opaque YAG seriously attenuates blue light. Poor conversion efficiency of the YAG is another drawback. The white made by (A) is too weak. The faint white given by (A) is unsatisfactory. The GaN type white color devices (A) can produce weak white light of a color temperature of 7000K.

(B-Type) ZnSe-Type White Color Light Source Device (ZnCdSe-Emission, ZnSe Substrate (Fluorescent); FIG. 2)

Another white color semiconductor device (B) is a ZnSe-type device which had been proposed by the same applicant as, ② Japanese Patent Application No. 10-316169, "White Color LED"

The B type white color device includes neither an InGaN emission LED nor a YAG fluorescent material. FIG. 2 shows a section of the B-type white color emission device. The B-type employs a zinc selenide (ZnSe) substrate 22 instead of a sapphire substrate. An epitaxial active (emission) layer 23 of zinc cadmium selenide (ZnCdSe) and other ZnSe films are epitaxially grown on the ZnSe substrate 22. The ZnCdSe epitaxial emission layer produces blue light of a 485 nm wavelength by electron bandgap transition. Arrows B indicate the 485 nm blue light. The zinc selenide ZnSe substrate 22 is n-ZnSe doped with iodine (I), aluminum (Al), indium (In), gallium (Ga), chlorine (Cl) or bromine (Br). The inventors of ② had discovered the fact that the impurity I, Al, In, Ga, Cl or Br acts in ZnSe as a kind of fluorescence center. The inventors of ② had found that the dope impurity I, Al, In, Ga, Cl or Br absorbs the 485 nm blue light B yielded by the ZnCdSe epi-layer 23 and produces yellow light (arrows Y) with a broad spectrum of a 585 nm peak. The blue light B emitted from the ZnCdSe epi-layer and the yellow light Y provided from the ZnSe substrate 22 go upward. Human eyes sense white color light W emitting from the device by unifying the blue B and the yellow Y (W=B+Y).

In practice, a dome-shaped white color ZnCdSe LED device was produced by fitting the LED chip of FIG. 2 on a lead, wirebonding a top electrode to another lead and molding the leads and the chip with transparent resin. The B-type white color device made use of the substrate itself as a kind of fluorescent material. Namely the upper ZnCdSe epi-layer positively produces blue light and the bottom ZnSe substrate passively emits yellow light by converting blue light to yellow light. B-type needs no extra fluorescence material, because the substrate plays the role of a kind of fluorescent material.

A substrate is indispensable for a light emitting diode (LED) as a bench of physically supporting the light emission layers. The substrate of the white color ZnCdSe-LED has another role of a fluorescence material. The ZnCdSe-LED doubly makes the best use of the ZnSe substrate as a supporter and a fluorescent. Since the substrate plays the role of the fluorescence material, the ZnCdSe-LED dispenses with an independent fluorescence material like YAG. Omission of fluorescence material is an advantage of the ZnCdSe-LEDs.

The emission from the impurity-doped ZnSe is called "self-activated (SA) emission" which is a kind of fluorescence induced by the impurity I, Al, In, Ga, Cl or Br as emission centers. The white color ZnSe-LEDs succeeds in making white colors of arbitrary color temperature between 10000K and 2500K by making use of the 485 nm sharp blue light and the 585 nm peaked broad yellow SA light. Thinning the ZnSe substrate or lowering the dopant concentration in the ZnSe substrate produces cooler white of higher color temperature by reducing the yellow SA light. Thickening the ZnSe substrate or heightening the dopant concentration in the ZnSe substrate makes warmer white of lower color temperature by reinforcing the yellow SA light. A variety of white colors of arbitrary color temperatures can be obtained by changing a substrate thickness, dopant concentration or a Cd ratio in ZnCdSe.

There are three wide bandgap semiconductors ZnSe, SiC and GaN as a candidate of blue light LEDs as cited before. SiC had lost the race because of poor efficiency caused by indirect interband transition. ZnSe had been once prevailing, because bulk single crystals of ZnSe could be produced. But InGaN-LEDs on sapphire substrates is the single winner in the blue light race due to a long lifetime, high luminosity, low-cost and high energy (short wavelength) at present.

As aforementioned, blue light ZnSe-LEDs had lost the blue light LED race to InGaN because of a shorter lifetime and a longer wavelength (lower energy) than InGaN. However ZnSe-LEDs of an impurity doped fluorescent substrate have a rich probability of reviving as white light LEDs. The B-type ZnSe white color devices have advantages of low cost, small-size, because the ZnSe white color LEDs can eliminate a fluorescence material like YAG and a step of supplying an LED chip with an extra fluorescence material. One purpose of the present invention is to provide a white color light emitting device which excels in cost, color rendering properties, weight, size and lifetime.

The above-mentioned GaN-type white light device (A) (YAG/InGaN-LED) allows the InGaN-LED to make short wavelength blue light of 460 nm (point m in FIG. 3) and the Ce-doped YAG to fluoresce yellow light point d in FIG. 3) with a 568 nm peak. Thus the GaN-type device (A) can synthesize any complex colors lying on straight line md in a chromaticity diagram in FIG. 3. The straight line md pierces the white color region encircled by a dotted curve. The YAG/InGaN-LED can synthesize white color light. The mentioned 7000K white means a point of X=0.31 and Y=0.32 within the white region on the chromaticity diagram. High color temperature derives from short wavelength blue of the InGaN-LED emission.

The other ZnSe-type white light source device (B) (ZnCdSe/ZnSe substrate) allows the ZnCdSe active layer to make long wavelength blue light of 485 nm (point j in FIG. 3) and the impurity (Al, In, Br, Cl, Ga or I) doped ZnSe to make yellow light with a 585 nm peak (point c in FIG. 3). Mixing of the 485 nm blue (j) with the 585 nm yellow (c) produces an arbitrary color lying on the line jc. Since the line jc traverses the white color region encircled by the dotted curve of FIG. 3, the ZnSe type (B) can yield a variety of white colors by changing the dopant concentration and the ZnSe substrate thickness.

The chromaticity diagram of FIG. 3 shows white colors of various color temperatures of 10000K, 8000K, 7000K, 6000K, 5000K, 4000K, 3000K and 2500K, which are all encircled by the dotted curve of the white region (W). A mild slanting of the line jc enables the ZnSe-type devices (B) to make a variety of white colors of different color temperatures. The ZnSe-type device (B) is superior to the InGaN-type device (A) in a rich variety of white colors.

[1. Advantages and Disadvantages of ZnSe-Type White Color Light Source Devices (B)]

FIG. 3 shows the synthesis of white color in the ZnSe-type white color light source devices (B) by the line jc which connects the 495 nm point j (ZnCdSe-LED blue) to the 585 nm point c (ZnSe-substrate yellow Y). The line jc partly coincides with the curved locus of white color light from 10000K to 2500K in the white color region (W). The coincidence enables the ZnSe-type device to make a variety of white colors with different color temperatures from 10000K to 2500K by changing thickness of the ZnSe substrate or impurity concentration in the ZnSe substrate. This is a strong point of the ZnSe-type device. Another advantage is a simple layer structure, simple electrodes and a small size similar to an ordinary LED.

Definition of a main wavelength is described now by referring to the chromaticity diagram in FIG. 3. All actual color spots exist in a region encircled by a horseshoe-shaped main curve abcdefghijkmn and a pure-violet line npqa. Numerals affixed to the curve show wavelengths of dotted color spots on the curve. If an object color spot is on the horseshoe-shaped curve, the main wavelength of the object spot is the same wavelength of the spot itself. If an object color spot exists within the curve, the main wavelength is defined to be the wavelength of the point at which an extension of the line connecting the object color spot with white center (x=0.333 an y=0.333) crosses the horseshoe-curve. The before cited blue light (B) emitted from the ZnCdSe active layer has a main wavelength of 485 nm (point j). The yellow rays (Y) fluoresced from the ZnSe has a main wavelength of 585 nm (point c).

ZnSe-type blue light LEDs are suffering from rapid degeneration and short lifetime. High current density causes and increases defects in ZnSe-LEDs. Occurrence of many defects forces the ZnSe-LEDs to cease emitting light. Short lifetime is an inherent, unsolved weak point of ZnSe-LEDs.

The ratio of blue light (B) to yellow light (Y) is another significant problem for making white light (W) by mixing yellow with blue. When high energy 445 nm blue light (InGaN-LED) is employed as LED light, the ratio (B/Y) of necessary blue light takes the minimum value (nearly B:Y=1:1). Use of low energy 485 nm (point j) blue light (ZnCdSe-LED) LED) forces the device to double the ratio of necessary blue light (nearly B:Y=2:1).

Blue light has less eye sensitivity than yellow light. ZnSe-type white light source device is inferior in emission efficiency, because ZnSe-type device requires much more blue light than GaN-LED type white light source devices.

[2. Advantages and Disadvantages of GaN-Type White Color Light Source Devices]

On the contrary, GaN-type white color devices (InGaN-LED+YAG) have advantages of high energy blue light wavelength between 460 nm and 445 nm and a moderate ratio B:Y=1:1 which is about half blue light power of the ZnSe-type white color devices (B:Y=2:1). Besides, the GaN-type devices enjoy long lifetime.

However, the GaN-type white color devices are annoyed with disadvantages of heating-degeneration of a YAG fluorescence material and a transparent resin by the heat yielded in the InGaN-LED and in the YAG itself. Fluorescence materials yield heat which corresponds to the difference between the excitation energy and the fluorescence energy. The transparent resin enclosing the YAG has poor heat conductivity. The heat yielded from the LED and the YAG raises the temperature of the YAG and the resin. The heat degenerates the resin by inducing cracks, gaps or burns. Another problem of the GaN-type white color device is an improvement of the lifetime of the fluorescence material and the resin surrounding the device. A further problem is a low light output efficiency due to random scattering of light by particles of YAG.

[3. Significance of Color Rendering Property of White Color Light Source Devices]

What is important is a color rendering property when a white color light source is employed as illuminating light source. The color rendering property is a measure of estimating how much an object white color is akin to natural white. The color rendering property is a complex concept defined as 100% for an ideal incandescent lamp which has a broad spectrum covering blue, green, yellow, orange and red. Ordinary fluorescent tubes have about 80% color rendering properties. 80% is a threshold. White light should have a color rendering property higher than 80% in order to win the white color light source race over the ordinary fluorescence tubes.

Above-mentioned known white light sources (A) and (B), which convert a part of LED-emitted blue into yellow, are inferior in the color rendering property. Poor color rendering property prohibits the known devices (A) and (B) from acting as illuminating white light sources. Reasons why the known white light sources (A) and (B) have a bad color rendering property are described.

[Reason 1] Blue light emitting diodes (ZnSe-LEDs or InGaN-LEDs) emit monochromatic blue light with a narrow spectrum. The white color devices containing the blue light LEDs have a poor color rendering property.

[Reason 2] The yellow light converted from the blue light by the devices (A) and (B) lacks green and red components. The yellow fluoresced from the Ce-doped YAG does not include green and red components. The yellow made by the impurity-doped ZnSe also lacks a green component. If a new device replaces an incandescent bulbs as an illuminating light source, the new device should include a wide scope of spectrum having the red and green components.

One purpose of the present invention is to provide a white color light emitting device which prohibits generated heat from degenerating a transparent resin and fluorescence materials. Another purpose of the present invention is to provide a white color light emitting device which enjoys a long lifetime. A further purpose is to provide a white color light emitting device which can enhance the output efficiency by reducing random scattering by a fluorescent material. A further purpose of the present invention is to provide a white color light emitting device which gives natural white light superior in a color rendering property.

The present invention proposes a ultraviolet type white color light emitting device (Q) and a blue type white color light emitting device (R) which are sets of an inherent light emitting diode (LED) and one or two (ZnSSe, ZnS, ZnSe) fluorescent plates. The ultraviolet type white color device (Q) assembles an ultraviolet light emitting diode (LED) and two fluorescence plates which fluoresce blue light and yellow light. The blue light type white color device (R) contains a blue light emitting diode (LED) and a fluorescence plate which makes yellow fluorescence.

Ultraviolet type Q=ultraviolet LED+first fluorescence plate+second fluorescence plate.

Blue light type R=blue light LED+fluorescence plate.

Type Q makes use of double fluorescence phenomena. Type R depends upon a single fluorescence phenomenon. Type Q and type R contain photoactive parts which act within below-cited scopes of wavelengths.

| [Type Q] | Ultraviolet LED = | 340 nm to 400 nm |
|---|---|---|
| | First ZnS fluorescent plate = | 480 nm (peak wavelength) |
| | Second $ZnS_xSe_{1-x}$ fluorescent plate = | 585 nm (peak wavelength). |
| [Type R] | Blue light LED = | 410 nm to 470 nm |
| | $ZnS_xSe_{1-x}$ fluorescent plate = | 568 nm to 580 nm |
| | (heat-treated $ZnS_xSe_{1-x}$) | x = 0.3 to 0.67 |
| | (untreated $ZnS_xSe_{1-x}$) | x = 0.2 to 0.6 |

[Q. Ultraviolet Type White Color Light Emitting Device (Ultraviolet LED+ZnS+ZnSe/ZnSSe)]

An ultraviolet type white color light emitting device (Q) of the present invention contains an ultraviolet InGaN-LED, a first ZnS fluorescence plate, and a second ZnSe or ZnSSe fluorescence plate. Ultraviolet rays of the InGaN-LED excites the first ZnS fluorescence plate. The ZnS first fluorescence plate generates blue light. The blue light excites again the second ZnSe or ZnSSe fluorescence plate. The second ZnSe or ZnSSe fluorescence plate yields yellow light. The blue fluoresce from the first fluorescence plate and the yellow fluorescence from the second ZnSe/ZnSSe fluorescence plate mix together and make white color light with high color rendering property. ZnSSe is an abbreviation of $ZnS_xSe_{1-x}$ (x: mixture rate).

Namely the white color light emitting device of the present invention consists of three emission elements.

A. Ultraviolet (UV) emitting InGaN-LED
B. Blue light (B) emitting first ZnS fluorescence plate
C. Yellow light (Y) emitting second ZnSSe(ZnSe) fluorescence plate Output light W includes only blue fluorescence and yellow fluorescence (W=B+Y).

The ultraviolet type (Q) employs ultraviolet ray light emitting diode (LED). Employment of invisible ultraviolet light LED for making white color features present invention. The ultraviolet rays should not emitted as output light, since invisible ultraviolet is of no use for synthesizing white. Whole of the ultraviolet rays produced by the InGaN-LED should be absorbed by the first ZnS fluorescence plate. All the ultraviolet power should be converted into blue fluorescence by the first ZnS fluorescence plate. Blue fluorescence excites the second ZnSe/ZnSSe fluorescence plate. The present invention makes the best use of fluorescence phenomena twice at two steps.

The gist of the ultraviolet type (Q) is the ultraviolet LED and two steps of fluorescence. No original ultraviolet rays, which is fully absorbed by the first fluorescence plates, are emitted outward. Two kinds of fluorescence (blue fluorescence and yellow fluorescence) emanate outward. In general, fluorescence has inherently a broad spectrum. Broad spectra favor the color rendering property which is a measure of estimating white color and is defined as 100% for natural incandescent lamps. The present invention proposes first an idea of synthesizing white light by combining two (blue and yellow) kinds of fluorescence. This is a quite novel invention.

The ultraviolet LED should emit ultraviolet rays of wavelengths between 340 nm and 400 nm. An InGaN-type LED having a high GaN rate can be an ultraviolet LED. ZnSe type LEDs having ZnCdSe active layers cannot make ultraviolet rays owing to narrow bandgaps.

Fluorescence has always a longer wavelength than that of the exciting light. A blue light LED is useless for making blue fluorescence. Production of blue fluorescence requires an independent light source capable of emitting light with higher energy or a lower wavelength. Fortunately, $In_{1-y}Ga_yN$-LEDs, which have been prevalently used as blue or green light LEDs, can be converted into ultraviolet LEDs by heightening a GaN rate y.

The gist of type (Q) is an ultraviolet LED and double fluorescence phenomena. Ultraviolet rays are all absorbed in the fluorescence plates. Two kinds of fluorescence (blue and yellow) are emitted outward from type (Q). Fluorescence has inherently a wide spectrum which is an advantage for a color rendering property. The white containing wide spectra having broad yellow and blue components is superior in the color rendering property.

[R. Blue Type White Color Light Emitting Device (Blue Light LED+Fluorescent Plate)]

R1. The present invention proposes a blue type white color light emittng device (R) having an InGaN-LED and a bulk/powder ZnSSe fluorescence plate piled upon the InGaN-LED. The InGaN-LED emits blue light (B). The ZnSSe fluorescence plate, which is either a single crystal or polycrystal bulk or powder solidified plate by a water-resistant transparent resin, absorbs blue light rays and produces yellow fluorescence (Y). Namely the ZnSSe fluorescence plate converts a part of blue light into yellow light with a broad spectrum. The ZnSSe/InGaN light source of the present invention makes white color light by mixing the yellow fluorescence (Y) with the blue light (B) (W=B+Y).

The InGaN-LED can be replaced by another blue light LED. This invention proposes another white color light source having a blue light LED other than InGaN-LED and a bulk/powder ZnSSe fluorescence plate piled upon the blue light LED.

R2. 410 nm–470 nm blue light emitted from a blue light LED

Blue light between 410 nm and 470 nm is high energy blue with short wavelengths. The 410 nm–470 nm blue corresponds to a lowest part nm of a blue region of a chromaticity diagram in FIG. 3. Such a short wavelength blue light cannot be produced by ZnSe LED having ZnCdSe active layer which emits 485 nm blue (point j). InGaN-LEDs are preferable candidates for the blue light making LED, since the InGaN-LEDs can produce short wavelength blue light of 410 nm to 470 nm. The weight of blue light in synthesized white can be controlled by changing a driving current of the InGaN LED. On-sapphire InGaN LEDs excel in lifetime, cost, reliability and utility. The mentioned known reference (A) used resin-diffused YAG which had been well known as a fluorescence material. But this invention does not employ the YAG unlike the known device (A). The present invention uses another material ZnSSe which has never known as fluorescent material before this invention.

R3. 568 nm–580 nm yellow fluoresced by ZnSSe

The 410 nm–470 nm blue light and 568 nm–580 nm yellow make white color light of an arbitrary color temperature between 3000K and 10000K.

R4. Impurity-doped $ZnS_xSe_{1-x}$ as fluorescence material $ZnS_xSe_{1-x}$ is a mixture of ZnS and ZnSe. A suitable range of a ZnS ratio x will be give later. The ratio x is often omitted for simplicity in this description. Pure ZnSSe does not fluoresce. ZnSSe obtains fluorescence performance by doping some impurity which becomes a emission center in ZnSSe. Suitable impurities are aluminum(Al), indium(In), gallium(Ga), chlorine(Cl), bromine(Br), iodine(I). The ZnSSe plate as a fluorescence material employed by the present invention should include at least one of Al, In, Ga, Br, Cl or I at a concentration higher than $1\times10^{17}$ cm$^{-3}$. Doping of the impurity less than $1\times10^{17}$ cm$^{-3}$ cannot cause sufficient fluorescence. The weight of yellow light in synthesized white light can be varied by changing the impurity concentration and the thickness of the fluorescence plate.

The aforementioned known reference (B) has employed an impurity doped ZnSe substrate as a fluorescence material. Instead of ZnSe, the present invention uses ZnSSe, a mixture of ZnS and ZnSe, as a fluorescence material. Nobody has known that impurity-doped ZnSSe acts as fluorescent material before the present invention.

Instead of 485 nm of a ZnCdSe-LED of ②, the present invention employs an exciting light source (e.g., InGaN-LED) of 410 nm to 470 nm, which are shorter than 485 nm. Other 410–470 nm light sources else than InGaN-LED can be available. The present invention makes use of a ZnSSe bulk plate or a power-solidified plate. The ZnSSe bulk means a single crystal bulk or a polycrystal bulk. The power-solidified plate means a plate constructed by a transparent resin dispersed with ZnSSe powder. ZnS and ZnSe have an inherent drawback of weak water resistance (water-absorptive). A single crystal ZnSSe is the best, since single crystal ZnSSe has the highest water-resistance, the lowest scattering the highest heat conduction and the least degeneracy. A polycrystal ZnSSe is the next best. A polycrystal having greater grains is better than another polycrystal having smaller grains. Bigger grains enable the polycrystal ZnSSe to reduce light scattering, water absorption, degeneration and to heighten heat conductivity and lifetime. Powder-solidified ZnSSe, which is dispersed into a transparent resin or glass, has disadvantages of poor water resistance, random light scattering, degeneration, low heat diffusion and short lifetime. High heat conduction of the bulk ZnSSe enables the fluorescence plate to release the heat induced into the ZnSSe plate quickly than other resin materials like epoxi resin or Si-resin. This works of the ZnSSe plate contribute to control heating and degeneracy.

ZnSSe (single or poly-crystals) bulks have another merit of good controllability of refraction and reflection of light at surfaces and high efficiency of outputting blue and yellow rays. However, ZnS Se bulks (single or poly-crystals) have drawbacks of difficult production and high cost.

Powder-solidified ZnSSe is suffering from low efficiency and short lifetime. However, powder-solidified ZnSSe has advantages of low cost and facile production. ZnSSe powder can be dispersed into an outer transparent resin for molding instead of an independent plate. In this case, processes of molding by resin and making the plate are done at the same time.

R5. ZnSe has a narrower bandgap. ZnS has a wider bandgap.

An intermediate material having an intermediate bandgap between ZnSe and ZnS can be made by changing the rate x of ZnS and the rate 1-x of ZnSe. A higher x realizes a higher bandgap, which induces yellow of a shorter wavelength. In the case of heat-treated ZnSSe fluorescence plates, a suitable range of x is from 0.3 to 0.67 ($0.3 \leq x \leq 0.67$). In the case of untreated ZnSSe fluorescence plates, a suitable range of x is 0.2 to 0.6 ($0.2 \leq x \leq 0.6$).

R6. Bulk ZnSSe is preferable for fluorescence plates. Furthermore, it is desirable that an average grain size of a ZnSSe polycrystal is larger than the thickness of the plate.

A polycrystal containing small grains have many grain boundaries, which have functions of leading water and scattering light causing optical loss. Large grains prevent water from infiltrating into the fluorescence plate. Large grains reduce random scattering of light at grain boundaries. The polycrystal having grains of sizes wider than thickness of the plate are suitable. Preferably, all grains are single in the direction of thickness.

R7. The best choice is a ZnSSe single crystal fluorescence plate. Single crystal is free from grains and grain boundaries which induce scattering, water infiltrating and degeneration. However, it is difficult to make single crystal of ZnSSe. Only a chemical vapor transportation method (CVT) is a practical method for making single crystal ZnSSe at present. But it takes long time to grow single crystal by CVT. Instead of high cost single crystal, bulk polycrystals are next favorable. It is not easy to make good polycrystalline ZnSSe. ZnSSe polycrystals, which are not low-cost yet, can be made by chemical vapor deposition method (CVD). Low cost fluorescence plates can be obtained by solidifying ZnSSe powder with a transparent resin or a glass.

R8. 410 nm–470 nm blue light is required. Some InGaN-LEDs can produce blue light of the range. Other LEDs than InGaN-LEDs can be utilized for the blue light source between 410 nm and 470 nm.

R9. Blue light wavelength $\lambda_{LED}$ emitted from the LED should satisfy an inequality of $\lambda_{LED} \geq 1239/(2.65+1.63x-0.63x^2)$, where x is the rate of ZnS and (1-x) is the rate of ZnSe in the fluorescence material. ZnSe (x=1) has a bandgap of 2.7 eV and an absorption edge wavelength of 460 nm. ZnS has a bandgap of 3.7 eV and an absorption edge wavelength of 335 nm. A bandgap energy of a mixture $ZnS_xSe_{1-x}$ is give by $Eg=2.7+1.63x-0.63x^2$, which is different from the denominator by 0.05. An absorption edge wavelength λg is calculated by dividing 1239 (=hc) by a bandgap Eg. The denominator in the inequality is different at the constant term of 2.65 from Eg (2.7). The above inequality of $\lambda_{LED}$ requires that the ZnSSe fluorescent plate should be excited by the blue light having lower energy (longer wavelength) than the bandgap of the ZnSSe. If ZnSSe were excited by light higher than the bandgap, ZnSSe itself emits bandgap transition light (blue) instead of the doped impurity, which could not make white light.

Inequality $\lambda_{LED}$ signifies that the blue light emitted from the InGaN-LED can reach inner portions of the ZnSSe fluorescence plate with least attenuation caused by the bandgap emission. In general, a semiconductor absorbs light whose energy is bigger than the bandgap and emits light of bandgap wavelength. If the blue light from the LED has energy larger than the bandgap, the blue light are absorbed and converted into blue light of the bandgap, which is a loss for the purpose of making yellow. Inequality $\lambda_{LED}$ forbids the bandgap emission in ZnSSe.

R10. Non-treated ZnSSe is available. However, heat-treatment in Zn atmosphere is effective for ZnSSe for reducing scattering or non-fluorescent absorption. Peak wavelengths and intensities are varied by the heat-treatment. An available x ranges from 0.3 to 0.67 (x=0.3–0.67) for heat-treated $ZnS_xSe_{1-x}$. A suitable range of x is between 0.2 and 0.6 (x=0.2–0.6) for untreated $ZnS_xSe_{1-x}$.

SUMMARY OF THE INVENTION

An ultraviolet type (Q: InGaN-LED/ZnS/ZnSe) white color light emitting devices of the present invention have a high color rendering property. The InGaN-LED/ZnS/ZnSe devices are suitable for illuminating white light sources because of the high color rendering property. Although a single device is still insufficient for illumination, an array of a plenty of equivalent white color devices of the present invention can supply sufficient power for illuminating as strong as an incandescent bulb or a fluorescent tube. The device has an advantage of a long lifetime, since a source element is an on-sapphire InGaN-LED which has been proved as a long lifetime device. Fluorescence materials are newly found ZnS, ZnSe or ZnSSe which had been annoyed at weak water resistance. Crystalline bulks with large diameters are preferably employed for enhancing the water resistance. In the case of low-cost powder ZnS or ZnSe is employed, the powder is fully encircled by water-resistant resin for preventing water from infiltrating into fluorescent plates. Thus fluorescent plates enjoy also a long lifetime. The white color devices are superior to the incandescent bulbs or fluorescence tubes.

The ultraviolet type (Q) makes the best use of two-step fluorescence phenomena. In both ZnS and ZnSe fluorescent plates, excitation light has energy lower than bandgap and penetrates into an inner space of the fluorescent materials. A part of the excitation light passes through the fluorescent plates. the choice of excitation wavelengths enabled the device to output both the fluorescent wavelengths (blue and yellow) for composing white color light. The present invention has advantages of a light weight and a small size, since the device can be encapsulated into a resin package similar to a low-cost LED.

This invention proposes a blue type white color light emitting device (R) including an InGaN blue light LED emitting blue light of 410 nm to 470 nm and a ZnSSe fluoresce plate having a broad spectrum with a peak between 568 nm and 580 nm. The ZnSSe/InGaN white color light source of the invention can produce white light of an arbitrary color temperature by synthesizing 410–470 nm blue light with 568–580 nm yellow light. The blue type white color light emitting device (R) has advantages of low-cost, small-size, high electric efficiency and long lifetime.

BRIEF DESCRIPTION OF THE DRAWINGS

FIG. 6 is a sectional view of a heat-treatment apparatus for heat-treating a ZnSe single crystal in Zn-vapor atmosphere.

FIG. 7 is a simplified structure of an ultraviolet type white color ZnSSe/ZnS/InGaN-LED device (Q) which produces ultraviolet rays by the InGaN-LED, converts the ultraviolet rays to blue light by the first ZnS fluorescent plate, converting part of the blue light into yellow light by the second ZnSSe fluorescent plate.

FIG. 8 is a wavelength diagram for showing the principle of a white color ZnSSe/ZnS/InGaN-LED device which synthesizes white color from blue fluorescence and yellow fluorescence by making ultraviolet rays of 340 nm–400 nm by the InGaN-LED, exciting the first ZnS fluorescence plate by the 340 nm–400 nm ultraviolet rays for producing blue light with a peak at 480 nm, exciting the second ZnSSe fluorescence plate by the 480 nm-peaked blue light for making yellow fluorescence light with a broad peak at 585 nm.

FIG. 9 is a relative emission spectrum of Embodiment 1 comprising an ultraviolet InGaN-LED, a first fluorescence plate and the second fluorescence plate. An abscissa is a wavelength (nm). An ordinate is relative emission power.

FIG. 10 is a sectional view of an embodiment of a blue type white color light emitting device (R) having a short wavelength blue light InGaN-LED and a ZnSSe fluorescent plate doped with Al, Ga, In, Br, Cl or I for synthesizing white light of an arbitrary color temperature by mixing the short wavelength blue (B) and fluorescing yellow (Y).

FIG. 11 is an enlarged view of the InGaN-LED and the ZnSSe plate of FIG. 10 for clarifying the synthesis of white light by exciting the ZnSSe plate by the InGaN blue light, inducing the yellow fluoresce from the ZnSSe plate and mixing the LED blue light (B) with the ZnSSe yellow light (Y).

DETAILED DESCRIPTION OF THE EMBODIMENTS

Figure 1:
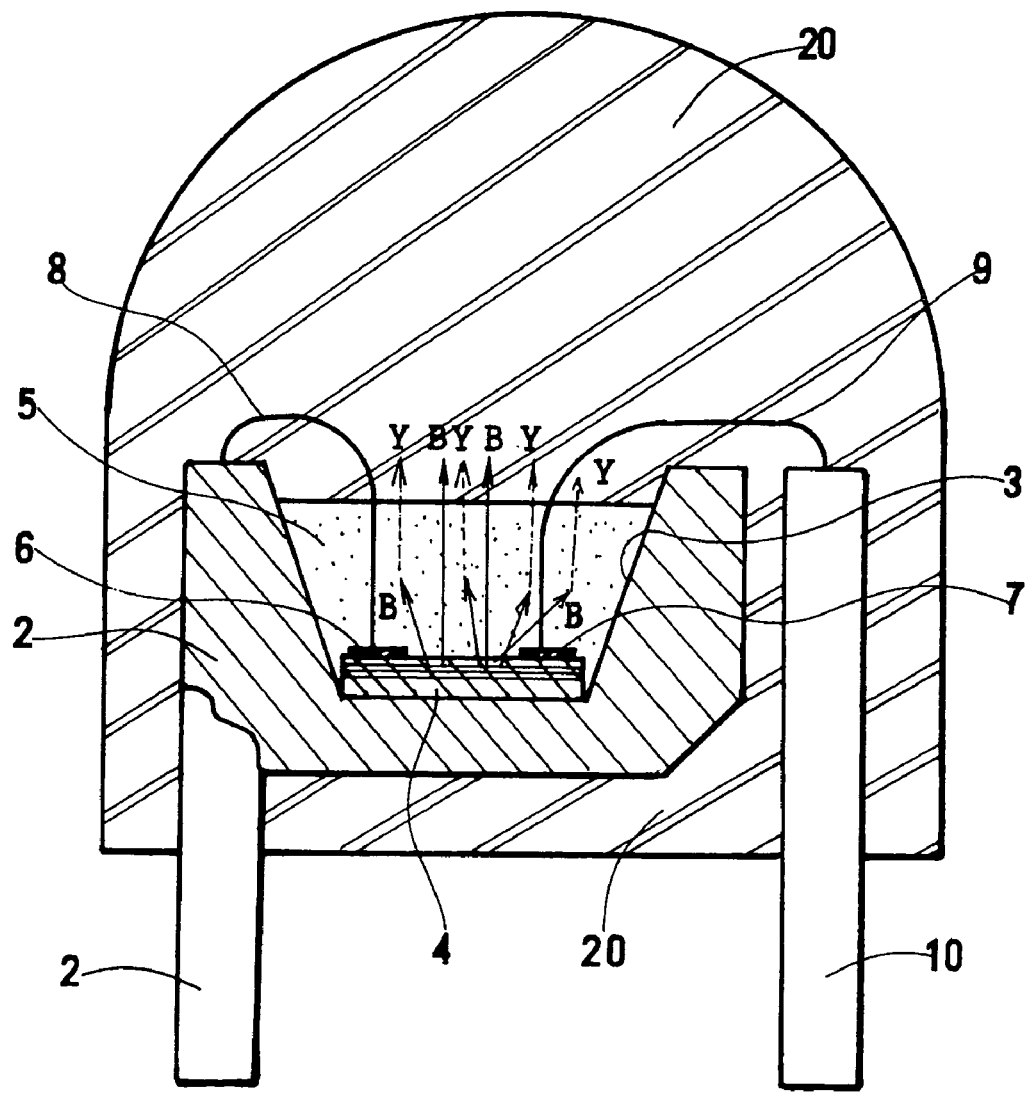
FIG. 1 is a sectional view of an GaN-type white color light source device A proposed by ① "White Color Light Emitting Device", edited by the committee of Manual of photoactive materials, published by Optoelectronics corporation, p457, June 1997.
Figure 2:
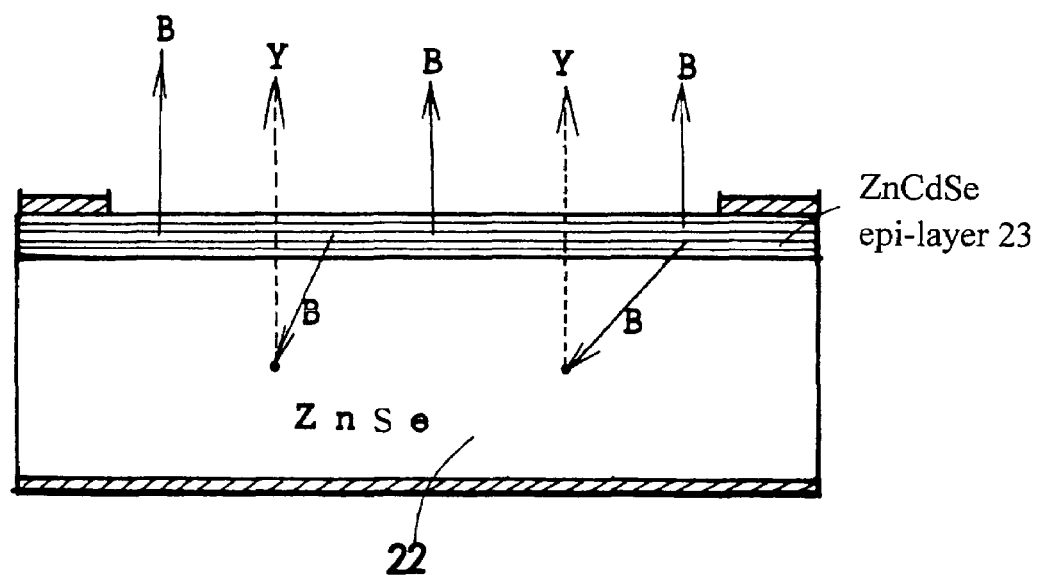
FIG. 2 is a sectional view of a ZnSe-type white color light source device B proposed by ② Japanese Patent Laying Open NO. 2000-82845 (Japanese Patent Application No. 10-316169), "White Color LED" which contains an impurity-doped ZnSe substrate for converting blue light to orange/yellow light and an ZnCdSe emission layer for producing blue light.

[Q. Ultraviolet Type White Color Light Emitting Device (Ultraviolet LED+ZnS+ZnSe/ZnSSe)]

First, an ultraviolet type (Q) is described.

Q. ultraviolet LED emission wavelengths=340 nm–400 nm
   ZnS (1st fluorescent plate) wavelengths=480 nm peak (blue)
   ZnSe/ZnSSe (2nd fluorescent plate) wavelengths=585 nm peak (yellow)

The inventor of the present invention looked for an appropriate fluorescence material which satisfies the above-cited requirements. The inventor first found that ZnS or ZnSSe can acquire a fluorescing property by doping group 3 elements or group 7 elements. The inventor hits a new idea of making blue light by exciting an impurity-doped ZnS by ultraviolet rays and making yellow light by exciting an impurity-doped ZnSSe or ZnSe by the blue light and synthesizing white from the blue and the yellow.

Type (Q) exploits one LED as a light source and two kinds of fluorescence. The functions of the fluorescence is briefly described as follows,

| A. InGaN-LED | UV |
|---|---|
| B. ZnS fluorescence plate | UV→B |
| C. ZnSSe (or ZnSe) fluorescence plate | B→Y |
| Output | W = B + Y, | where UV means ultraviolet,
B means blue,
Y indiactes yellow and W means white.

where UV means ultraviolet, B means blue, Y indicate yellow and W means white.

The first fluorescence material is zinc sulfide (ZnS), one of wide bandgap semiconductors. The second fluorescence material is zinc sulfide/selenide ($ZnS_xSe_{1-x}$) which has a bandgap than narrower ZnS.

FIG. 7 denotes basic components of the Type (Q) for synthesizing white by mixing blue light rays (B) and yellow light rays (Y). The lowest stratum is an InGaN-LED, the middle is a ZnS fluorescent plate, the upper one is a ZnSSe fluorescent plate. The InGaN-LED produces ultraviolet rays (UV), which are fully absorbed by the ZnS plate. The ZnS makes blue fluorescence rays (B). The blue rays excite the second ZnSSe fluorescent plate, which yields yellow rays (Y). The ultraviolet rays vanish in the ZnS plate. Only the blue rays and the yellow rays go outward, which seems to be white for human eyes.

FIG. 8 shows ranges of emission wavelengths of each stratum of the ZnSe(ZnSSe)/ZnS/InGaN device (Q). 340 nm is a bandgap wavelength of ZnS. If the ZnS ware excited by high energy light with a wavelength shorter than 340 nm, the bandgap transition would be introduced, which should be forbidden. The InGaN-LED produces ultraviolet between 340 nm and 400 nm. The 340 nm–400 nm ultraviolet is converted by the ZnS plate to blue light with a broad spectrum having a 480 nm center. 465 nm is a bandgap of ZnSe. The 480 nm centered blue light is converted by the ZnSe fluorescent plate to yellow having a wide spectrum with a center at 585 nm.

[Q1. First Fluorescence Plate (ZnS)]

Pure ZnS is not fluorescent. Doping of Al, In, Ga, Cl, Br or I endows ZnS with fluorescence property. The fluorescence has energy lower than the bandgap energy. The inventor thought that the doped impurity may build donor levels below a conduction band and acceptor levels above a valence band. The fluorescence would be induced by transitions between the donors and the acceptors. A variety of donor and acceptor levels may widen a spectrum of the fluorescence.

Absorbing the ultraviolet rays, the ZnS plate makes fluorescence of a blunt spectrum with a center wavelength of about 480 nm. The fluorescence spectrum stretches from blue via green to yellow/green which are results of superposition of a variety of transitions between donor/acceptor levels built by the impurity.

Zinc sulfide (ZnS) is excited by high energy ultraviolet rays of a wavelength shorter than 400 nm and produces fluorescence light with a broad spectrum having a 480 nm peak and covering blue, green and green/yellow. In short the ZnS fluorescence is represented as "blue fluorescence". Blue light LEDs which emits light of a wavelength longer than 400 nm cannot induce ZnS to fluoresce. Then the longest (lowest energy) limit of the wavelength emitted by the InGaN-LEDs is 400 nm in the present invention. The shortest (highest energy) limit of the InGaN-LED emission is 340 nm. The reason will be clarified later. Thus the range of the InGaN-LEDs emission wavelength is from 340 nm to 400 nm.

Definition of ultraviolet rays is still fluctuating. A definition of ultraviolet is an intermediate region between X-rays and visible light. Another definition of ultraviolet rays is a wavelength range from 13 nm to 393 nm. According to the definition from 13 nm to 393 nm, the range (340 nm–400 nm) of InGaN-LED emission wavelength of the present invention should consist of a 53 nm partial range of ultraviolet rays (340 nm–393 nm) and a 7 nm partial range of violet light (393 nm–400 nm). Although the InGaN-LED light includes both ultraviolet and violet, the light emitted by the InGaN-LED is represented as "ultraviolet" LED light in short.

[Q2. Second Fluorescence Plate ($ZnS_xSe_{1-x}$: $0 \leq x<1$)]

A second fluorescence plate is made from $ZnS_xSe_{1-x}$ ($0 \leq x<1$), which is a mixture of ZnS(zinc sulfide) and ZnSe(zinc selenide). Nobody had known that $ZnS_xSe_{1-x}$ fluoresces. The known reference ② of the present applicant had found that impurity-doped ZnSe (the lowest limit x=0 of $ZnS_xSe_{1-x}$) emits 585 nm peaked broad yellow/orange SA (self-activated) emission by 485 nm ZnSe-LED blue light. There is no report describing that $ZnS_xSe_{1-x}$ ($0<x<1$) fluoresces. The inventor of the present invention found out that if $ZnS_xSe_{1-x}$ ($0 \leq x<1$) is doped with an impurity of aluminum (Al), indium (In), gallium (Ga), bromine (Br), chlorine (Cl) or iodine(I), $ZnS_xSe_{1-x}$ obtains a fluorescence property for blue light excitation. The doped impurity atoms act as SA (self-activated) emission centers in $ZnS_xSe_{1-x}$ ($0 \leq x<1$).

The inventor found that ZnSe is excited by 480 nm blue light and yields 585 nm-centering yellow light with high efficiency. Although the center wavelength is 585 yellow, the fluorescence spectrum widely pervades yellow/green via yellow to red.

$ZnS_xSe_{1-x}$, which is a mixture of ZnS and ZnSe, has a bandgap wider than ZnSe. Differences between donors and acceptors induced by doped impurities are also enhanced. The wavelengths of exciting light and fluorescence light are shorter than ZnSe. The inventor further discovered that ZnSSe is excited by blue light of a wavelength shorter than 480 nm and yields fluorescence having a peak wavelength shorter than 585 nm with high efficiency. Yellow/green and yellow components rise and a red component decreases in the fluorescence spectrum of ZnSSe. The fluorescence spectrum of ZnSSe can be controlled by varying x.

[Q3. Synthesis of Two Kinds of Fluorescence Rays]

White with a wide spectrum which covers all visible light regions is synthesized by mixing the blue fluorescence from ZnS and yellow fluorescence from ZnSSe (or ZnSe). High color rendering property is accomplished by mixing two broad spectra of blue and yellow.

Production of the white of high color rendering property imposes some requirements upon the thickness F of the first (ZnS) fluorescent plate and the thickness H of the second (ZnSe or ZnSSe) fluorescence plate.

A first requirement is that the ultraviolet rays of the InGaN-LED should be fully absorbed by the ZnS first fluorescence plate. A second requirement is that the blue fluorescence is not fully absorbed in the second ZnSSe (ZnSe) fluorescence plate.

Rays from the InGaN-LED and the ZnS fluorescence plate have two dimensional extensions. But a one dimensional change of the intensity or rays is considered now for simplicity. $\alpha$ is an absorption coefficient of the-ultraviolet rays from the InGaN-LED in the ZnS fluorescence plate. The distance from an initial surface of the first ZnS fluorescence plate to an arbitrary point is denoted by "z". An initial intensity of the ultraviolet rays at z=0 is denoted by "1". Ultraviolet intensity at a point z in the ZnS fluorescence plate is given by $exp(-\alpha z)$. At a rear surface (z=F) of the first ZnS fluorescence plate, the ultraviolet intensity is $exp(-\alpha F)$.

The best is that all the ultraviolet rays are absorbed and fully converted into blue fluorescence. However the above value does not decrease just to 0. A condition that the value should be less than 0.1 or another condition that the value should be smaller than 0.01 is imposed upon the value. For example, if the ultraviolet rays should decrease down to a rate less than 0.1 at an end of the first fluorescence plate, the requirement establishes an inequality, $$exp(-\alpha F) \leq 0.1. \quad (1)$$

The inequality determines an allowable thickness F of the first fluorescence plate. The same condition can be written as, $$F \geq 2.3/\alpha. \quad (2)$$

Otherwise, if the ultraviolet rays should decrease down till 0.01 at the end of the fluorescence plate, a scope of the allowable thickness of the first fluorescent plate should satisfy, $$F \geq 4.6/\alpha. \quad (3)$$

(3) determines the lowest limit of the thickness F of the first ZnS fluorescence plate. A thick fluorescence plate raises cost. The upper limit should be determined from a standpoint of economy.

Another condition determines the scope of the thickness H of the second ZnSSe fluorescence plate. $\beta$ denotes an absorption coefficient of blue in the ZnSSe fluorescence plate. $B_0$ indicates an initial intensity of blue at a beginning surface of the ZnSSe (Z=F) fluorescence plate. Intensity of blue at a point z ($F<z\leq F+H$) in the second ZnSSe fluorescence plate is given by $B_0 \exp(-\beta(z-F))$. $\gamma$ is a conversion coefficient from blue to yellow in the second ZnSSe fluorescence plate. Yellow intensity Y(z) is written as, $$Y=(\gamma B_0/\beta)\{1-\exp(-\beta(z-F))\}. \quad (4)$$

Intensity B of blue and Intensity Y of yellow at a final surface (z=F+H) of the second ZnSSe fluorescence plate are $$B=B_0 \exp(-\beta H). \quad (5)$$

$$Y=(\gamma B_0/\beta)\{1-\exp(-\beta H)\}. \quad (6)$$

The white color of the present invention is synthesized by mixing blue fluorescence B and yellow fluorescence Y at a pertinent rate. The mixing rate B/Y is given by $$\frac{\beta}{Y}=\frac{\beta}{\gamma\{\exp(\beta H)-1\}} \quad (7)$$

Parameters $\beta$ and $\gamma$ can be varied by changing impurity doping concentration. H is the thickness of the second fluorescence plate. The B/Y ratio can be controlled by varying the impurity concentration or changing the thickness H of the second fluorescence plate.

In other words, when the ratio B/Y and the conversion efficiency $\gamma$ and the absorption coefficient $\beta$ are predetermined, Eq. (7) is an equation of determining the thickness H of the second fluorescence plate.

Parameters $\beta$ and $\gamma$ can be varied by changing impurity doping concentration. H is the thickness of the second fluorescence plate. The B/Y ratio can be controlled by varying impurity concentration or changing the thickness H of the second fluorescence plate.

In other words, when the ratio B/Y and the conversion efficiencies $\beta$ and $\gamma$ are predetermined, Eq. (7) is an equation of determining the thickness H of the second fluorescence plate.

[Q4. Difficulty of Weak Water-Resistance]

Fluorescence materials are generally used to be crushed into fine particles and are randomly dispersed into a transparent medium for catching light beams as many as possible. The YAG fluorescent material of the known reference ① was also crushed into fine powder. The YAG powder has high water-resistance. Powdering causes no problem. Dispersing fine particle powder to a transparent matrix is a common use of almost all fluorescence materials. Newly proposed ZnS and ZnSe have a serious difficulty of weak water-resistance. If ZnS or ZnSe is pulverized into fine powder, the ZnS or ZnSe powder soon degenerates by absorbing water in the atmosphere. The reason why ZnS and ZnSe have not been utilized as fluorescent materials is high water absorbent property and low reliability caused by the water absorption.

Thus, ZnS and ZnSe have no history of being employed as a fluorescence material. The reason why a fluorescence material should be pulverized is that the material is opaque for object light and the bulk material would fully shield the object light. This is a normal use of ordinary opaque fluorescence materials. Opaque bulk would shield light.

Thus, the ordinary opaque material should be pulverized. When a material of high water absorbency is pulverized, the material would rapidly degenerate by absorbing surrounding water even if the powder is encapsulated with resin or glass. Thus, people believe that water-absorbent materials cannot be a fluorescence material. Besides, people believe that opaque fluorescence materials cannot be formed into a bulk fluorescence plate, because the bulk fully shields object light.

[Q5. Bulk Fluorescence Materials]

Powder is apt to absorb water due to wide effective surface areas. Powder has weak water resistance. On the contrary, a large bulk should have strong water resistance. Narrow effective surface areas of a bulk will prevent water from infiltrating into the bulk material. High water absorption is an inherent drawback of ZnS, ZnSe or ZnSSe. The inventor noticed that it is effective for overcoming the weak water resistance to form ZnS, ZnSe or ZnSSe into a large-sized bulk, for example, a large single crystal or a large grain polycrystal. Water infiltrates via grain boundaries into inner parts. A single crystal without grain boundary should be strong against water infiltration. A large grain polycrystal with few grain boundaries should also have a strong resistance against water invasion.

The inventor hit upon an idea of a fluorescence material bulk of ZnS, ZnSe or ZnSSe instead of the conventional powder dispersed fluorescence fluid. The idea of the bulk fluorescence plate is another significant new idea of the present invention.

[Q6. Limitations of Wavelengths of Excitation Light]

Conventional fluorescence materials have been used to be pulverized into fine particles and to be dispersed in a transparent resin or glass. The reason why the conventional fluorescence materials are dispersed in a resin or glass is that the materials are opaque to object light. A bulk plate is useless since the opaque bulk shields the object light. This invention wants to utilize weak water resistant materials to be fluorescence materials. Shaping a material into bulks is effective to improve water resistance. Bulk-shaping requires transparency of the material to the object light. Namely, the transparency is indispensable for fluorescence material bulks. The transparency imposes a new additional condition upon the fluorescence materials of ZnS, ZnSe and ZnSSe.

What gives the transparency to the weak water-resistant materials of ZnS, ZnSe and ZnSSe? Inherently ZnSe and ZnS are transparent for visible light (yellowish transparency). ZnSe and ZnS are also transparent for near-ultraviolet. However, ZnSe and ZnS entirely absorb high energy ultraviolet with wavelengths slightly shorter than the bandgap. The present invention thinks the condition that should restrict the wavelength of exciting light. $\Lambda r$ is a wavelength of exciting light. $\lambda g$ is a bandgap wavelength (absorption edge wavelength) of the fluorescence material. The above-explained transparency condition can be expressed by an inequality of $$\Lambda r > \lambda g. \tag{8}$$

The inequality (8) determines the lowest limit of wavelengths $\Lambda r$ of the excitation light. This is a fully novel idea about selecting fluorescence materials. The highest limit of wavelengths $\Lambda r$ is determined by the ability of inducing fluorescence on the object materials.

The inequality (8) is satisfied by selecting exciting light with energy lower than the bandgaps or with a wavelength longer than the bandgap wavelength (absorption edge wavelength).

The exciting light with a wavelength $\Lambda r$ longer than $\lambda g$ is seldom absorbed by the materials. The exciting rays can infiltrate deep into the inner space. The deep infiltration alleviates the influence of surfaces of the fluorescence materials. The inequality (8) is required for remedying the inherent weak water resistance.

The bandgap energy Eg of $ZnS_xSe_{1-x}$ at room temperature is approximated into an equation of $$Eg = 2.7 + 1.63x - 0.63x^2. \text{(eV)} \tag{9}$$

The unit is eV (electron volt). An absorption edge wavelength $\lambda g$ (nm) is calculated by dividing 1239 by a bandgap Eg.

$$\lambda g = 1239/Eg \text{ (nm)}. \tag{10}$$

Eq.(9) teaches us a bandgap of ZnSe (x=0), ZnS(x=1) and ZnSSe crystals. An absorption wavelength $\lambda g$ is given by Eqs. (9) and (10).

[Q7. Restriction on the Wavelength of an Ultraviolet InGaN-LED]

The bandgap Eg of zinc sulfide (ZnS) is Eg=3.7 eV at room temperature. The absorption edge wavelength $\lambda g1$ is $\lambda g1$=340nm. ZnS absorbs the light having energy larger than the bandgap Eg=3.7 eV. Excitation light should reach an inner part of a ZnS plate without attenuation. The excitation wavelength $\Lambda r$ should be larger than the absorption edge wavelength $\lambda g1$ ($\Lambda r > \lambda g1$=340 nm). This inequality gives the lower limit of the excitation wavelength $\Lambda r$. The upper limit of the excitation wavelength is given by the condition of inducing fluorescence from the ZnS. The upper limit is 400 nm as explained before. Thus, the scope of the excitation wavelength $\Lambda r$ of the ultraviolet InGaN-LED ranges from 340 nm to 400 nm.

$$340 \text{ nm} \leq \Lambda r \leq 400 \text{ nm}. \tag{11}$$

The range includes ultraviolet rays (340 nm–393 nm) and violet rays (394 nm–400 nm). In short, the range of 340 nm–400 nm required for InGaN-LEDs is called "ultraviolet". $In_xGa_{1-x}N$-LEDs are not restricted in visible blue light or green light. $In_xGa_{1-x}N$-LEDs can produce short wavelength ultraviolet rays by reducing an In rate x and enhancing a Ga rate (1-x).

[Q8. Limitation of Wavelengths of ZnS Fluorescence Plate]

The fluorescence wavelength made from the ZnS fluorescence plate is denoted by $\Lambda q$. This is excitation light for the second ZnSe fluorescence plate. How long wavelength $\Lambda q$ should the first ZnS fluorescence plate make? The wavelength $\Lambda q$ depends upon the material of the second fluorescence plate. In the case of ZnSe as a second fluorescence plate, the excitation wavelength should be longer than 465 nm, because a ZnS bandgap is 2.7 eV, which corresponds to an absorption edge wavelength 460 nm (=$\lambda g2$), and the exciting light should penetrate deep into the inner volume ($\Lambda q > \lambda g2$).

A central (peak) wavelength of the blue light from the first ZnS fluorescence plate is 480 nm ($\Lambda q$). The exciting wavelength satisfies the requirement of $\Lambda q > \lambda g2$, because 480 nm ($\Lambda q$) is longer than 465 nm($\lambda g2$). The first fluorescence with a broad peak having a 480 nm center includes a small wavelength part shorter than 465 nm.

ZnSe is suitable for catching 480 nm light and for making yellow fluorescence. Thus, it is favorable that the ZnS fluorescence has a 480 nm-centered spectrum.

In the case of mixture $ZnS_xSe_{1-x}$ as a second fluorescence plate, the excitation wavelength should be longer than 465 nm, because a $ZnS_xSe_{1-x}$ bandgap is higher than 2.7 eV, which corresponds to an absorption edge wavelength λg3 shorter than 465 nm(=λg2; λg2>λg3), and the exciting light should penetrate deep into the inner volume (Λq>λg3). The fluorescence of the second $ZnS_xSe_{1-x}$ has a broad spectrum with a central wavelength shorter than 585 nm.

[Q9. Impurity Concentration of Doped Fluorescence Plates]

Pure ZnS, ZnSSe and ZnSe are non-fluorescent. ZnS, ZnSSe and ZnSe are endowed with fluorescence properties by doping ZnS, ZnSSe and ZnSe with impurities of Al, In, Ga, Cl, Br or I with an impurity concentration higher than $1\times10^{17}$ $cm^{-3}$. The absorption coefficient β increases in proportion to the impurity concentration. Thus, the impurity concentration is an important parameter ruling the design of the fluorescence plates. In some cases, ZnS, ZnSSe or ZnSe should be intentionally doped with these impurities. Or some crystal fabrication methods unintentionally dope ZnS, ZnSSe or ZnSe with these impurities. In these cases, there is sometimes no need of doping ZnS, ZnSSe or ZnSe with impurities further more. Even in these cases, the impurity concentration should be controlled.

[Q10. Heat-Treatment of Fluorescent Plates]

As described before, larger grain sizes are preferable for ZnSe, ZnSSe and ZnS crystals as fluorescent plates due to high resistance against water-absorption. Polycrystalline ZnSe, ZnSSe and ZnS plates composed of small grains are apt to degenerate owing to poor water-resistance. Single crystals ZnSe, ZnSSe or ZnS are the best owing to the highest water-resistance and the least light scattering. Polycrystals of an average grain diameter larger than a thickness of the plate are the next best. These single crystals and polycrystals are made by an iodine transport method. But, since these crystals have slanted emission wavelengths, the crystals should be heat-treated. The emission properties of these crystals are changed by the heat-treatment in a Zn atmosphere. The emission wavelengths are changed into preferable wavelengths by the heat-treatment. Concretely, in the Zn atmosphere, the ZnSe, ZnSSe or ZnS crystals are treated by a high temperature heat of about 1000° C. and defects of those crystals can be decreased. In result, the fluorescence light is reinforced and the non-radiative loss is restrained.

[Q11. Mirror-Polishing of Fluorescence Plates]

It is preferable to mirror-polish incidence surfaces of the ZnS, ZnSSe or ZnSe fluorescence plates for enhancing the incidence rate. It is further desirable to form antireflection films on the incidence surfaces of the ZnS, ZnSSe or ZnSe fluorescence plates. Other surfaces can be left either unpolished or polished. It is useful to process the surfaces of the fluorescence plates for enhancing the output rates of blue or yellow light.

[R. Blue Light Type White Color Light Source Device (Blue LED+Fluorescent Plate)]

Another white color light source of a blue light type (R) of the present invention is now described.

R. Blue light wavelength emitted by LED=410 nm–470 nm $ZnS_xSe_{1-x}$ mixture rate x (heat-treated)=0.3–0.67 x(untreated)=0.2–0.6

Fluorescence wavelength=568 nm–580 nm $ZnS_xSe_{1-x}$ which is a mixture of ZnS and ZnSe has another free-choice parameter x, a mixture rate, in addition to the concentration of impurities (Al, In, Ga, Br, Cl or I). X=0 means ZnSe with a bandgap $Eg_{ZnSe}$=2.7 eV. X=1 means ZnS with a bandgap $Eg_{ZnS}$=3.7 eV. A bandgap energy of $ZnS_xSe_{1-x}$ varies as a function of x. When x changes from 0 to 1, the bandgap Eg increases from 2.7 eV to 3.7 eV by 1 eV. The inventor thinks that fluorescence is caused by transitions between deep donors and deep acceptors made by the impurities. Thus, the fluorescence intensity is proportion to the concentration of the impurities via the number of deep donors and acceptors: Then, the central wavelength Λq of fluorescence is longer than the bandgap wavelength λg(=hc/Eg) (absorption edge wavelength).

The central wavelength Λq (568 nm–580 nm) of ZnSSe fluorescence is far longer than the bandgap wavelength λg (=hc/Eg; 335 nm–460 nm) of ZnSSe.

Changing of the bandgap Eg of ZnSSe can vary the fluorescence wavelength Λq induced by electron transitions between donors and acceptors. Another advantage of ZnSSe as fluorescence materials is the controllability of the fluorescence wavelength Λq by the bandgap Eg.

[R1. Fluorescence Plate]

Impurity-doped ZnSe (x=0) has a main fluorescence wavelength $Λq_{ZnSe}$=585 nm. A desirable scope of fluorescence wavelengths Λq is 568 nm to 580 nm. Thus, what is required is to shorten the fluorescence wavelength from $Λq_{ZnSe}$=585 nm by 5 nm to 17 nm. Impurity-doped ZnS (x=1) has a main fluorescence shorter than 568 nm. The fluorescence wavelength Λq of ZnSSe will continuously change as a function of x. Then, any wavelength between 568 nm and 580 nm can be obtained by an impurity-doped $ZnS_xSe_{1-x}$ crystal with an appropriate x from 0 to 1.

A concrete relation between x and Λq of doped $ZnS_xSe_{1-x}$ will be later described.

[R2. Doping Concentration of Fluorescence Plate]

Small dopant concentration gives $ZnS_xSe_{1-x}$ no fluorescence property. Impurity concentration (c) of more than $1\times10^{17}$ $cm^{-3}$ is required for obtaining the fluorescence property ($c \geq 1\times10^{17}$ $cm^{-3}$). High concentration of impurities heightens the rate of yellow light in white. Low concentration of impurities heightens the rate of blue light in white. Variation of thicknesses of fluorescence plates also changes the ratio of yellow light power. Namely, the yellow rate can be freely controlled by the thickness of the fluorescence plate or the concentration of the doped impurities.

[R3. Water-Resistance of Fluorescence Plates]

A serious problem is a low water-resistance of ZnS, ZnSe or ZnSSe crystals. ZnSSe, in particular powder ZnSSe, has a strong tendency of absorbing water. ZnSSe degenerates by absorbing water from the surrounding atmosphere. Ordinary fluorescence materials, for example, YAG (yttrium aluminum garnet), have strong water-resistance. An enduring fluorescence panel can be made by dispersing powder of water-resistant fluorescence materials into a transparent resin or glass, since the dispersed powder absorbs no water. On the contrary, poor water-resistance of ZnSSe is unfavorable for making a powder-dispersed fluorescence panel. Thus (single or polycrystal) bulk ZnSSe is preferable for producing long lifetime fluorescence panels. A single crystal ZnSSe bulk is the most favorable. Polycrystals of large grains are preferable to small grains. Powder ZnSSe should be dispersed in a transparent resin or glass for protecting powder grains from infiltration of water. The powder-solidified panel is inexpensive and easy to produce.

The problem of water-absorption is serious for ZnSSe particles which have relatively wide surface areas. A sphere of a radius r has a surface area of $4\pi r^2$ and a volume of $(4\pi/3)r^3$. The surface/volume rate is 3/r. The rate is reduced by enlarging r. Since water infiltrates via a surface, wide effective surfaces relative to volume accelerate absorption of water. To reduce surfaces and to increase a volume are effective for enhancing the water-resistance.

[R4. Transparency of Fluorescence Plates]

It is important to introduce blue light to inner parts of the fluorescence plate. If blue light were absorbed at superficial portions, fluorescence would be generated mainly by the superficial portions. The fluorescence would deeply depend upon the state of superficial portions which are easily degenerated by absorbing water. This is one reason why the exciting light should infiltrate deep into the inner space of the fluorescence plates. If almost all of the exciting light were absorbed at opaque superficial portions, a thick extra inner part would be vain. As described before, the ordinary fluorescence plates have been made by dispersing opaque fluorescent material powder in a transparent resin or glass for allowing exciting rays to invade into an inner space and illuminate inner portions. This invention preferably employs a bulk fluorescence plate instead of a powder dispersed resin: If the fluorescence material were opaque, no exciting light could infiltrate in the fluorescence plates. What contrivance is required for guiding the exciting light inward?

Transparent fluorescence materials are the answer of the above-mentioned problem. If a fluorescence material is nearly transparent for the exciting light, the exciting light can invade deep into an inner space of the fluorescence plate. Ordinary fluorescence materials are opaque. But this invention employs nearly transparent fluorescence plates for the exciting light. Transparency allows the exciting light (object light) to invade into the fluorescence plate. Then, what contrivance gives transparency to the fluorescence plates? The inventor thought of an idea of employing exciting light having energy lower than the bandgap of the fluorescent material. Pure semiconductors do not absorb the light with a wavelength longer than the bandgap wavelength.

ZnS has a wide bandgap whose energy is higher than blue light emitted by the InGaN-LED. ZnSe has another bandgap whose energy is lower than blue light emitted by the InGaN-LED. There is a critical $x=x_c$ which gives a mixture $ZnS_xSe_{1-x}$ having a bandgap $Eg_c$ equal to the energy of $\lambda_{LED}$ emitted from the InGaN-LED ($Eg_c=1239/\lambda_{LED}$). $ZnS_xSe_{1-x}$ having x larger than the critical rate $x_c (x>x_c)$, which has a bandgap smaller than $Eg_c=1239/\lambda_{LED}$, is transparent to $\lambda_{LED}$. The transparent $\lambda_{LED}$ can penetrate into the $ZnS_xSe_{1-x} (x>x_c)$. The problem that the fluorescence plate should be transparent to $\lambda_{LED}$ is then solved by choosing $ZnS_xSe_{1-x}$ ($x>x_c$).

Selection of $ZnS_xSe_{1-x}(x>x_c)$ enables the fluorescence plate to reduce absorption coefficient, to allow blue light into inner parts of the fluorescence plate, and to generate yellow fluorescence rays at all inner portions. Furthermore, choice of $ZnS_xSe_{1-x}(x>x_c)$ can exclude the influence of superficial portions which are apt to degenerate by absorbing water.

[R5. Mixture Rate x]

The same requirement can be imposed upon a condition of selecting a blue light LED for a predetermined $ZnS_xSe_{1-x}$ plate with Eg. Namely, the requirement determines $\lambda_{LED}$ by an inequality $\lambda_{LED} > 1239/Eg$.

$ZnS_xSe_{1-x}$ has a bandgap Eg;

$$Eg_{ZnSSe} = 2.7 + 1.63x - 0.63x^2 \text{ (eV)}. \quad (12)$$

Energy of light E can be replaced by wavelength $\lambda$(nm) by dividing 1239 by E (eV). Then, the condition that $ZnS_xSe_{1-x}$ should be transparent to $\lambda_{LED}$ is represented by $$\lambda_{LED} \geq \frac{1239}{2.65 + 1.63x - 0.63x^2} \quad (13)$$

The inequality determines a preferable range of $\lambda_{LED}$ for a predetermined x. Sets of a mixture rate x and a minimum wavelength $\lambda_{LEDmin}$ of allowed $\lambda_{LED}$ are listed on table 1.

TABLE 1

Minimum allowable wavelength $\lambda_{LEDmin}$ of an LED for mixture rate x of ZnSSe fluorescence plates

| x | $\lambda_{LEDmin}$ (nm) |
|---|---|
| 0 | 467 |
| 0.1 | 441 |
| 0.2 | 420 |
| 0.252 | 410 |
| 0.3 | 402 |
| 0.4 | 387 |
| 0.5 | 374 |
| 0.6 | 364 |
| 0.7 | 356 |
| 0.8 | 349 |
| 0.9 | 344 |
| 1.0 | 339 |

The emission wavelength of the $In_yGa_{1-y}N$-LED can be varied by changing the mixture ratio y of In. The preferable scope of emission wavelengths of the InGaN-LEDs is 410 nm to 470 nm as described before. However, InGaN-LEDs can produce red light with wavelengths longer than 470 nm. A rise of the In ratio y displaces an emission peak toward a longer wavelength range. An increase of the Ga rate (1-x) moves the emission peak toward a shorter wavelength range. The ZnS ratio x in $ZnS_xSe_{1-x}$ is x=0.252 for 410 nm emission as shown in Table 1. A bandgap wavelength $\lambda g$ is shorter than 410 nm for a ZnS ratio x more than 0.252 (x≧0.253; $\lambda g \leq 410$ nm). Thus, for the scope of 1>x>0.252, the inequality (13) is no more a condition of restricting the emission wavelength $\lambda_{LED}$ of InGaN-LEDs. On the contrary, for a range of 0<x≦0.252, the bandgap wavelength of ZnSSe is longer than 410 nm, the inequality (13) is a condition for restricting the emission wavelength $\lambda_{LED}$ of the InGaN-LEDs. Otherwise, another blue LED which can emit blue light of a wavelength between 410 nm and 470 nm is available for a light source LED.

Figure 3:
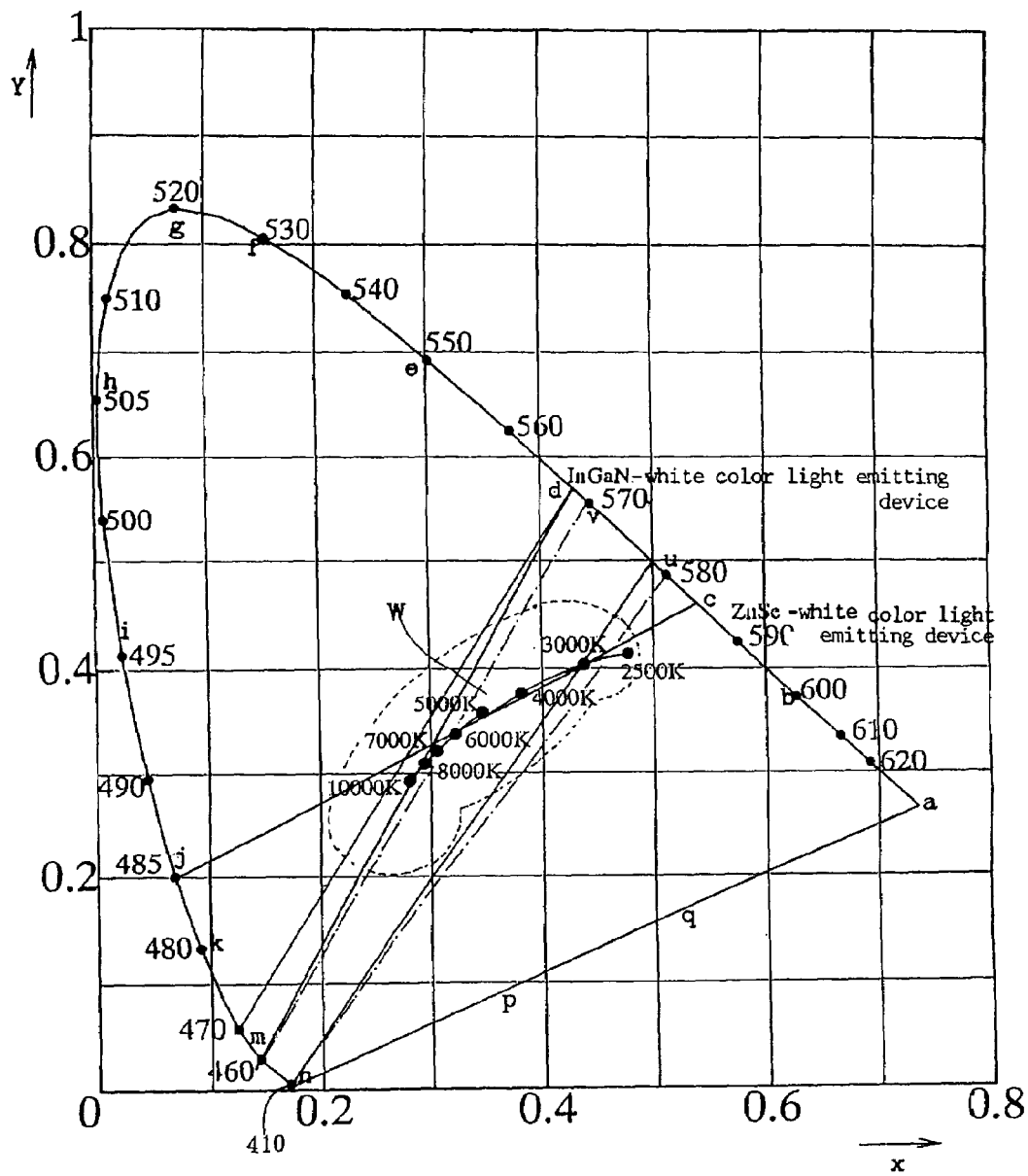
FIG. 3 is a chromaticity diagram for clarifying the principle of producing white light by mixing blue LED light and yellow fluorescence.

$\lambda_{LED}$ should be from 410 nm to 470 nm. The ZnS rate x restricts further the range of actual $\lambda_{LED}$. For example, for x=0.1 ($ZnS_{0.1}Se_{0.9}$), 470 nm≧$\lambda_{LED}$≧441 nm. For x=0.2 ($ZnS_{0.2}Se_{0.8}$), 470 nm≧$\lambda_{LED}$≧420 nm. The ZnS ratio of x=0 satisfies the condition 470 nm≧$\lambda_{LED}$ from the inequality (13) showing $\lambda_{LED}$≧467 nm. However, x=0 should be rejected because x=0 does not satisfies the requirement that the fluorescence wavelength should be between 568 nm and 580 nm from the chromaticity diagram of FIG. 3.

Otherwise, the inequality (13) can be interpreted that a predetermined $\lambda_{LED}$ of the InGaN-LED should determine a range of a mixture ratio x of ZnS of fluorescence plates.

Besides this condition, the ZnS mixture ratio x of the fluorescence plate must satisfy another condition that the main fluorescence wavelength $\Lambda q$ should range from 568 nm to 580 nm (568 nm<$\Lambda q$<580 nm). The main fluorescence wavelength $\Lambda q$ of ZnSSe is determined by the bandgap Eg. However, the relation between $\Lambda q$ and Eg is not clear yet. The relation will be described later by results of experiments.

[R6. Single Crystal Fluorescence Plate, Polycrystal Fluorescence Plate]

Single crystal ZnSSe is the best for the ZnSSe fluorescence plate. Single crystal has advantages of non-grain boundary, which scatters light at random by fluctuation of refractive index, and facile processing for shaping into a flat fluorescence plate. Namely, a (100) oriented single crystal ZnSSe wafer can easily be divided into fluorescence plates of arbitrary sizes by scribing the single crystal wafer along cleavage planes. Besides single crystal, polycrystalline ZnSSe is also available. Polycrystalline ZnSSe wafers can be cut into chips by mechanical dicing instead of natural cleavage. Grain boundaries reduce conversion efficiency by inducing light scattering and light absorption. Larger grain boundaries are preferable to smaller ones for the reason. A polycrystal plate consisting of grains larger than a thickness of a fluorescence plate is desirable. Single crystal or poly-crystal ZnSSe bulks are expensive due to a difficulty of making single or poly-crystal ZnSSe. Low-cost powder ZnSSe is also available for a fluorescence plate. Another fluorescence plate can be produced by mixing a transparent resin or a transparent glass with powder ZnSSe and hardening the mixed material. The resin or glass including powder ZnSSe has disadvantages of large scattering loss and weak water-resistance(water-absorbency). But a strong point of low-cost may compensate the disadvantages for the use of ZnSSe powder fluorescence plates.

[R7. Mirror-Polishing of the Fluorescence Plates]

It is desirable to mirror-polish a surface of the fluorescence plate on which blue LED light goes for enhancing the incidence power. A rough surface scatters blue input light. Another surface does not require mirror-polishing. An addition of an antireflection film on the blue light input surface raises output power. The antireflection film is produced by piling a set of dielectric layers in turn on the surface of the ZnSSe plate.

Another contrivance for enhancing the output efficiency of yellow light is also profitable.

[R8. Wavelength of Blue Light LED]

The range of blue light is explained. The above-mentioned optimum blue light has a wavelength of 445 nm. Other wavelength blue light than 445 nm is also available. An optimum wavelength of exciting blue light depends upon an emission spectrum of an exciting LED and a conversion efficiency of a fluorescence plate.

The range of blue light is determined from the performance of ZnSSe fluorescent of converting blue to yellow. The main wavelength of the blue light should be from 410 nm to 480 nm from the standpoint of the blue-yellow conversion. However, the chromaticity diagram teaches us that the main wavelength of the blue light should range from 410 nm to 470 nm from the purpose of producing white color by mixing with yellow fluorescence.

The wavelength range of blue light restricts the wavelength range of the ZnSSe fluorescent through the purpose of producing white color. The chromatic diagram determines that the main ZnSSe fluorescence wavelength should be 568 nm to 580 nm for making white by mixing the 410–470 nm blue light.

The wavelength range of 568 nm to 580 nm determines a pertinent range of the mixing rate x of ZnS in the $ZnS_xSe_{1-x}$ to be 0.2 to 0.67 ($0.2 \leq x \leq 0.67$).

Current InGaN blue light LEDs have the highest emission efficiency at wavelengths between 400 nm and 450 nm at present. The emission efficiency of the current InGaN LEDs falls for longer wavelengths than 450 nm. However, 450–470 nm blue light can synthesize white light by inducing yellow light in ZnSSe fluorescent. 400–410 nm light cannot synthesize white light by mixing with yellow from ZnSSe fluorescent. Thus, an effective range of the blue light wavelength is from 410 nm to 470 nm in the present invention.

[R9. Heat-Treatment of Fluorescence Plates]

Absorption efficiency of ZnSSe for blue light can be adjusted by the temperature of a heat-treatment in a Zn atmosphere. The heat-treatment of ZnSSe crystals increases the absorption of blue light. The heat-treatment changes the wavelength dependence of fluorescence upon the mixture rate x. The mixture rate x should be 0.3 to 0.67 ($0.3 \leq x \leq 0.67$) for the ZnSSe with heat-treatment. The adjustment of blue light absorption is important for synthesizing white color by mixing the induced yellow light with the original blue light. ZnSSe without heat-treatment is also available for making a fluorescence plate. The mixture ratio x should be from 0.2 to 0.6 ($0.2 \leq x \leq 0.6$) for the ZnSSe without heat-treatment.

Figure 4:
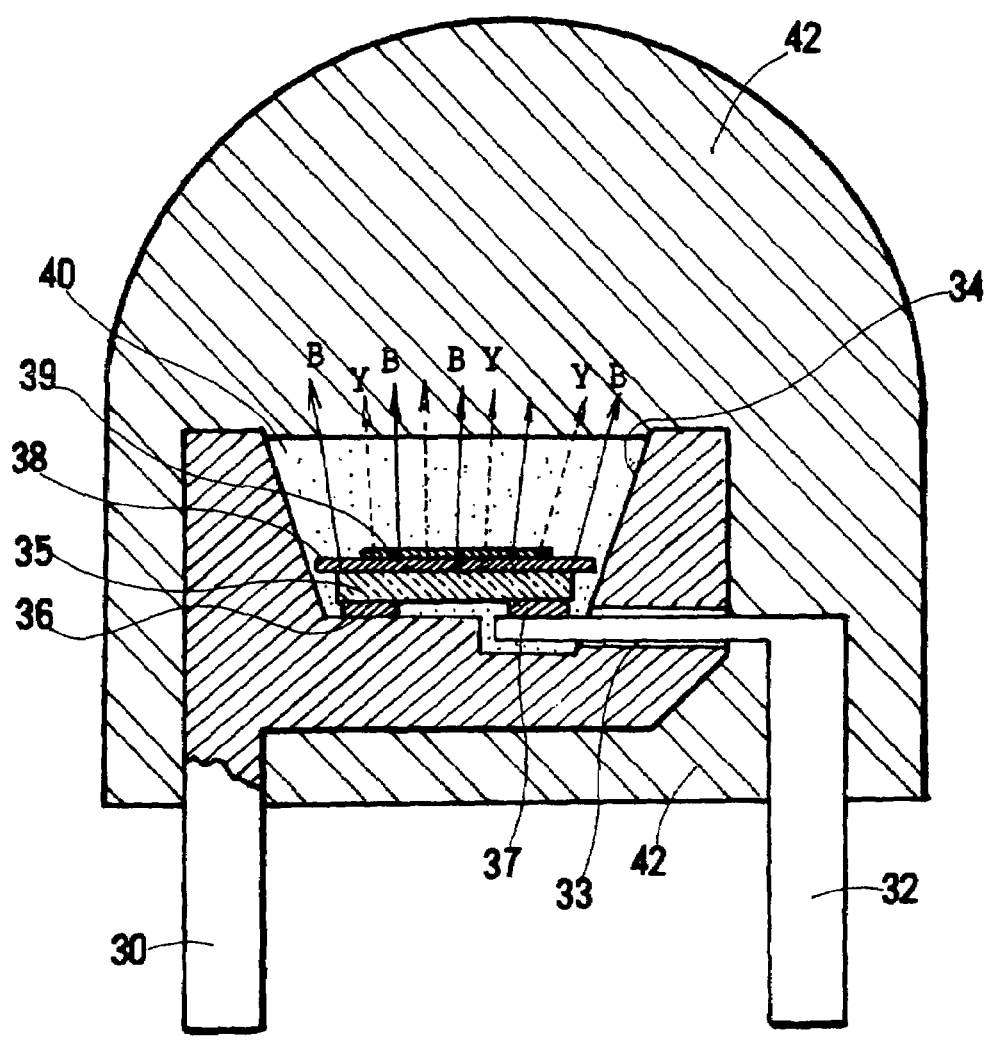
FIG. 4 is a sectional view of a dome-shaped white color light emitting device as an embodiment of the present invention which is produced by coupling a Γ-shaped lead having a cavity to an L-shaped lead, bonding an ultraviolet InGaN-LED on a bottom of the cavity, piling a first fluorescence plate and a second fluorescence plate of the LED, filing the cavity with a transparent resin dispersed with a scattering material and molding the leads with transparent resin into a dome-shaped device.

[Embodiment 1 (Ultraviolet Type (Q): FIG. 4]

FIG. 4 shows a sectional view of Embodiment 1 of an ultraviolet type white color light emitting device (Q). There are two leads consisting of a Γ-shaped lead 30 and an L-shaped lead 32. A narrow horizontal hole 33 is bored on a front wall of the Γ-shaped lead 30. Two leads are coupled by inserting a horizontal tip of the L-shaped lead 32 into the horizontal hole 33 pierced in the Γ-shaped lead 30. The Γ-shaped lead 30 has a cavity 34. An ultraviolet light emitting diode (LED) 35 which has a sapphire substrate, an InGaN active layer and top electrodes 36 and 37 is upside down (epi-down) mounted with the electrodes 36 and 37 facing downward on the bottom of the cavity 34. The sapphire substrate lies on the electrodes 36 and 37 in the ultraviolet sapphire/InGaN-LED 35. One electrode 36 is joined to the Γ lead 30. The other electrode 37 is bonded on the L-lead 32. The upside down posture enables the LED to dispense with wirebonding. Alternatively, the LED can be bonded epi-up on the bottom of the cavity 34 on the lead 30 and connected to the lead by wires like FIG. 1. Junctions between the leads and the electrodes are optional.

A first fluorescent plate 38 made of zinc sulfide (ZnS) is laid just upon the ultraviolet InGaN-LED 35. The first fluorescent plate 38 absorbs ultraviolet rays from the InGaN-LED 35 and emits blue light. Namely, the first fluorescent plate 38 converts ultraviolet rays to blue light. A second fluorescent plate 39 made of ZnSe is piled upon the first fluorescent plate 38. The second fluorescent plate 39 absorbs the blue light from the first fluorescent plate 38 and yields yellow light. Thus, the second fluorescent plate 39 converts the blue light to the yellow light. As shown in FIG. 4, the first fluorescent plate 38 is wider than the second fluorescent plate 39. A part of the blue light beams B directly go upward from the first fluorescent plate 38 without passing the second fluorescent plate 39. A transparent resin 40 dispersed with a scattering material is filled in the cavity 34 for covering the ultraviolet LED 35, the first fluorescent plate 38 and the second fluorescent plate 39. The first fluorescent plate 38 yields the blue fluorescence light (B) and the second fluorescent plate 39 generates the yellow light (Y). The yellow light beams (Y) and blue light beams (B) are emitted upward and are scattered by the scattering material at random. A set of the blue beams and yellow beams looks white for human eyes.

Figure 5:
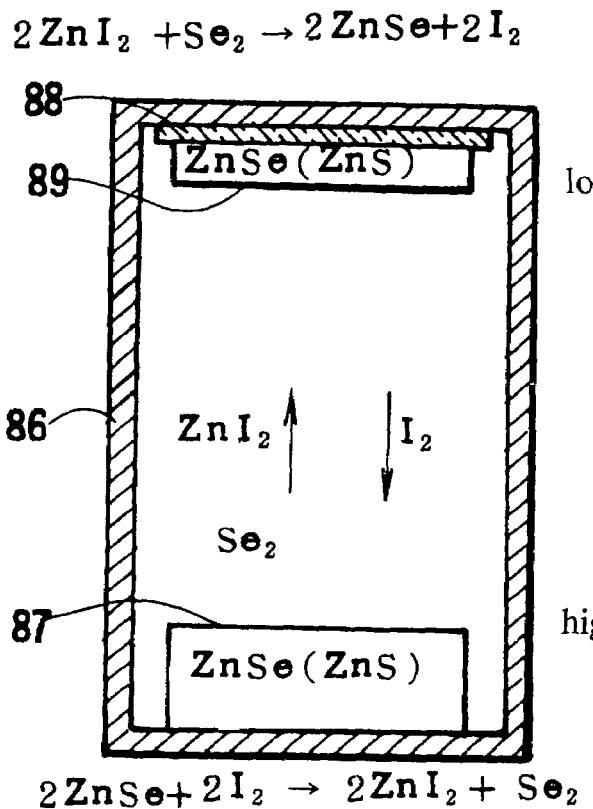
FIG. 5 is a sectional view of a chemical vapor transportation apparatus for producing a ZnSe single crystal from a ZnSe polycrystal by sublimating the polycrystal ZnSe, converting ZnSe to $ZnI_2$ and $Se_2$ by a reaction $2ZnSe+2I_2 \rightarrow 2ZnI_2+Se_2$, transporting $ZnI_2$ and $Se_2$ to a ZnSe seed and piling ZnSe on the ZnSe seed.

A method of making the white color light source device. A chemical vapor transportation (CVT) method utilizing iodine (I) as a transporting medium makes a ZnS bulk single crystal and a ZnSe bulk single crystal. The CVT method grows a single crystal bulk by positioning a ZnS or ZnSe polycrystal at a bottom of a vessel and a ZnS or ZnSe seed on a ceiling of the vessel, filling the vessel with iodine ($I_2$), heating the vessel under an iodine atmosphere, converting ZnS or ZnSe to $ZnI_2$ and $S_2$ or $ZnI_2$ and $Se_2$, evaporating $ZnI_2$ and $S_2$ or $ZnI_2$ and $Se_2$, and piling ZnS or ZnSe on the top single crystal seed of ZnS or ZnSe. FIG. 5 shows the chemical vapor transportation apparatus.

A reaction chamber 86 contains a ZnSe (or ZnS) polycrystal 87 at a bottom. A seed 89 of ZnSe (or ZnS) single crystal is installed via a susceptor 88 on a ceiling of the chamber 86. Iodine ($I_2$) is introduced into the chamber 86 for establishing an iodine atmosphere in the chamber. The polycrystal ZnSe (or ZnS) material 87 at the bottom is heated to a higher temperature T1. The single crystal ZnSe (or ZnS) seed 89 is heated to a lower temperature T2 (T2<T1). Reversed temperature distribution induces chemical transportation from the bottom to the top via iodine.

At the hotter region (T1) on the ceiling, a reaction of iodizing takes place,

$$2ZnSe + 2I_2 \rightarrow 2ZnI_2 + Se_2. \quad (14)$$

$ZnI_2$ and $Se_2$ are vapors at T1. The vapors $ZnI_2$ and $Se_2$ diffuse from the bottom upward to the single crystal seed at the top of the vessel. At the ceiling at a lower temperature T2, a reverse reaction of selenidization occurs,

$$2ZnI_2 + Se_2 \rightarrow 2ZnSe + 2I_2. \quad (15)$$

Synthesized ZnSe molecules are piled upon a bottom surface of the seed crystal 89. Vapor $I_2$ molecules diffuse back from the top to the bottom and come to contact with the ZnSe polycrystal 87 for inducing the above-cited iodizing reaction (14). Repetitions of the $ZnI_2$ and ZnSe transportations grow a ZnSe single crystal on the seed 89. The CVT method can be utilized also for growth of ZnSe or ZnSSe single crystal bulks. The growing speed is slow of about 1 mm/day.

A (100) ZnS single crystal wafer of a 300 μm thickness is cut from the grown ZnS bulk. The (100) ZnS wafer is heat-treated in a Zn-atmosphere at 1000° C.

The Zn-atmosphere heat-treatment is effective to reduce defects. The heat-treatment can be done in a common apparatus. FIG. 6 shows a heat-treatment apparatus 90. The ZnSe or ZnS single crystal wafer 89 is laid in the heat-treatment apparatus 90, heated up to 1000° C. (ZnSe) or slightly more than 1000° C(ZnS), maintained at 1000° C. or more than 1000° C. for 50 hours and cooled down at a rate of −60° C./min to room temperature.

Both surfaces of the heat-treated ZnS wafer are polished into mirror flatness. The mirror-polished ZnS wafer is scribed and cut into 400 μm square ZnS plates 38 of a 200 μm thickness.

Similarly, the heat-treated ZnSe wafer is also mirror-polished on both surfaces, is scribed and is cut into a 300 μm square ZnSe plate 39 of 100 μm thickness.

An on-sapphire ultraviolet InGaN-LED 35 of a 380 nm peak wavelength is prepared. The InGaN-LED 35 is upside down in a flip-chip mode on a bottom of a cavity of a leadpin 30 with the sapphire substrate upward as shown in FIG. 4. One electrode pad is bonded on the leadpin 30 and the other pad is joined on the other leadpin 32. The first ZnS fluorescent plate 38 is glued to the sapphire substrate of the LED 35 by a transparent resin adhesive.

The second ZnSe fluorescence plate 39 is further piled upon the first ZnS fluorescence plate 38 via a transparent adhesive. A transparent resin 40 dispersed with scattering particles (for example, silicon carbide; SiC) is supplied to the cavity of the top of the leadpin 30. The top part of the leadpins is transfermolded with a transparent molding resin 42 in a metallic die with dome-shaped cavities. Dome-shaped white color light sources are produced as shown in FIG. 4. The white color device emits white color light of about 5000° C. when electric current is supplied. The device can make low color temperature white colors.

The spectrum of the white color light source device of Embodiment 1 is investigated. FIG. 9 shows the emission spectrum. The abscissa is wavelength (nm). The ordinate is relative emission strength. The emission rises at about 400 nm and attains a high plateau from 455 nm to 490 nm, which corresponds to the emission of the first ZnS fluorescent plate excited by the 380 nm ultraviolet InGaN-LED. The fluorescence of the first ZnS plate extends from violet via blue to green.

There is another broad peak from 530 nm via a top 585 nm to 650 nm in the spectrum, which is induced by the second fluorescence plate. The second broad peak includes yellow, orange and red. The fluorescences from the first plate and the second plate are partly superposed between 490 nm and 540 nm which are blue and green regions. The spectrum covers the whole region of visible light from 440 nm to 650 nm. The intensity of the blue light from 450 nm to 480 nm is denoted by "1" here. Yellow, orange and red regions between 540 nm and 600 nm have about 0.9 to 0.95 of intensity. The green region from 495 nm to 520 nm is slightly weak. But, even the weak green has more than 0.78 of intensity. The InGaN/ZnS/ZnSe complex device of the invention reveals an ideal broad spectrum spanning from 440 nm to 650 nm as a white color source. An average color rendering property of Embodiment 1 is 89, which is as high as three-wavelength type current fluorescence tubes. The high color rendering property denotes the superiority of the InGaN/ZnS/ZnSe white color device as an illuminating light source.

[Embodiment 2 (Blue Light Type (R); Fluorescence Wavelength Λq Dependence Upon Mixture Ratio x]

$ZnS_xSe_{1-x}$ bulk crystals of x=0, 0.1, 0.2, 0.3, 0.4, 0.5, 0.6, 0.7 and 0.8 are produced by a chemical transportation method using iodine ($I_2$) as a transport medium for investigating fluorescence wavelength Λq dependence upon mixture ratio x. Sample $ZnS_xSe_{1-x}$ plates are made by cutting the bulk crystals. The $ZnS_xSe_{1-x}$ plate samples are heat-treated for 50 hours in a Zn atmosphere at 1000° C.

The $ZnS_xSe_{1-x}$ plate samples are irradiated by blue light of 440 nm emitted from an InGaN-LED. The $ZnS_xSe_{1-x}$ plate samples produce fluorescence having a broad peak with a varying peak wavelength. Main fluorescence wavelengths Λq are estimated from the fluorescence spectra. Table 2 shows the main fluorescence wavelengths Λq for the $ZnS_xSe_{1-x}$ plate samples of x=0, 0.1, 0.2, 0.3, 0.4, 0.5, 0.6, 0.7 and 0.8, which are irradiated by 440 nm blue light.

TABLE 2

Main fluorescence wavelengths Λ q for the heat-treated $ZnS_xSe_{1-x}$ plate samples of x = 0, 0.1, 0.2, 0.3, 0.4, 0.5, 0.6, 0.7 and 0.8, which are irradiated by 440 nm blue light

| x(ZnS ratio) | Main fluorescence wavelength Λ q |
|---|---|
| 0 | 585 nm |
| 0.1 | 583 nm |

TABLE 2-continued

Main fluorescence wavelengths Λq for the heat-treated $ZnS_xSe_{1-x}$
plate samples of x = 0, 0.1, 0.2, 0.3, 0.4, 0.5, 0.6, 0.7 and 0.8,
which are irradiated by 440 nm blue light

| x(ZnS ratio) | Main fluorescence wavelength Λq |
|---|---|
| 0.2 | 581 nm |
| 0.3 | 580 nm |
| 0.4 | 578 nm |
| 0.5 | 575 nm |
| 0.6 | 571 nm |
| 0.7 | 567 nm |
| 0.8 | 562 nm |

Analysis of the chromaticity diagram teaches us that the main fluorescence wavelengths Λq should be longer than 568 nm but shorter than 580 nm (568 nm≦Λq≦580 nm) for synthesizing white colors by mixing with the prescribed blue light between 410 nm and 470 nm. In table 2, Λq=580 nm corresponds to x=0.3. In consideration of the table 2, Λq=568 nm corresponds to x=0.67. When the ZnS ratio x exceeds 0.67, the main fluorescence wavelength Λq overruns the lower limit 568 nm. When the ZnS rate x is smaller than 0.3, the main fluorescence wavelength Λq overshoots the upper limit of 580 nm. The inventor discovered that a suitable range of x should be from 0.3 to 0.67 (0.3≦x≦0.67) for the heat-treated $ZnS_xSe_{1-x}$ fluorescence plates for synthesizing white colors.

[Embodiment 3 (Blue Light Type (R); x=0.4, $\lambda_{LED}$=450 nm, Λq=578 nm)]

A single crystal (100) ZnSSe wafer of a 200 μm thickness is cut from a $ZnS_{0.4}Se_{0.6}$ single crystal of x=0.4. The (100) ZnSSe wafer is heat-treated at 1000° C. in a Zn atmosphere. The absorption coefficient is adjusted by the heat-treatment. The single crystal ZnSSe wafer is mirror-polished on both surfaces into a 100 μm (0.1 mm) thickness. The (100) ZnSSe mirror wafer is scribed and divided into a plurality of ZnSSe fluorescence plates of a 300 μm square with a 100 μm thickness.

A 450 nm blue light LED chip 47 having a sapphire substrate, GaN layers and an InGaN active layer is prepared. The blue light LED 47 has two electrodes on the top. The ZnSSe fluorescence plate 48 is glued to the substrate of the LED chip with a transparent adhesive. FIG. 10 shows the structure of a white light LED of the embodiment. A larger Γ-shaped leadpin 44 and a smaller L-shaped leadpin 45 are unified by inserting a horizontal arm of the L-shaped leadpin 45 into a horizontal hole pierced in the larger Γ leadpin 44. The larger Γ leadpin 44 is not in contact with the L lead 45. Two leads are electrically separated. The Γ leadpin 44 has a cavity 46 on the top. The InGaN-LED 47 unified with the ZnSSe fluorescence plate 48 is upside down mounted on the bottom of the cavity 46.

Unlike an ordinary LED of FIG. 1, the LED of embodiment 3 is fitted in the cavity 46 by die-bonding an electrode 50 to the Γ lead 44 and another electrode 52 to the L lead 45. The ZnSSe plate 48 is loaded on the substrate of the LED. A transparent resin 49 dispersed with a diffusion material (e.g., silicon carbide powder; SiC) is filled in the cavity 46. The unified leadpins are transfermolded with a transparent resin 56 into a dome-shaped LED device as shown in FIG. 10. When a current is supplied to the leadpins, blue light is made in the InGaN active layer. The blue light passes the sapphire substrate and the ZnSSe fluorescence plate 48. The ZnSSe fluorescence plate 48 absorbs the 450 nm blue light and produces 578 nm yellow fluorescence light. The yellow light and blue light are scattered and diffused by the diffusion powder. Yellow light and blue light emanating from the ZnSSe/InGaN-LED look white light for human eyes. Embodiment 3 obtains white light of a color temperature of 3000K. FIG. 11 shows production of white light from the ZnSSe/InGaN-LED which mixes blue light (B) of the InGaN-LED with yellow (Y) fluorescence of the ZnSSe plate.

[Embodiment 4 (Blue Light Type (R); x=0.6, $\lambda_{LED}$=420 nm, Λq=571 nm)]

A (100) ZnSSe wafer of a 200 μm thickness is cut from a CVT-grown single crystal bulk $ZnS_xSe_{1-x}$ of x=0.6 ($ZnS_{0.6}Se_{0.4}$) The ZnSSe wafer is heat-treated at 1000° C. in a Zn atmosphere. Both surfaces of the wafer are mirror-polished to a mirror wafer of a thickness of 100 μm. The ZnSSe mirror wafer is scribed and divided into a plurality of fluorescence plates of 300 μm×300 μm×100 μm.

An on-sapphire InGaN-LED chips 47 with an emission wavelength 420 nm are prepared. The LED chips 47 are fitted upside down to a bottom of the cavity 46 of the leadpin 44 with a sapphire substrate upward as shown in FIG. 10. Electrode pads on the bottom of the chip 47 are directly joined to the leadpins 44 and 45. The $ZnS_{0.6}Se_{0.4}$ fluorescence plate 48 is glued to the sapphire substrate of the LED 47 with a transparent resin adhesive. A transparent resin 49 dispersed with scattering material powder (SiC) is filled to the cavity 46 for covering the InGaN-LED chip 47 and the $ZnS_{0.6}Se_{0.4}$ fluorescence plate 48. Top parts of the pins 44 and 45 are molded with a transparent resin 56 into a dome-shaped device. When the white color light emitting device is supplied with current, the device emits white color light of a color temperature of 5000K.

[Embodiment 5 (Blue Light Type (R); Variation of Fluorescence Wavelengths as a Function of ZnS Rate x of Untreated $ZnS_xSe_{1-x}$ Fluorescence Plates)]

$ZnS_xSe_{1-x}$ crystal bulks of x=0, 0.1, 0.2, 0.3, 0.4, 0.5, 0.6, 0.7 and 0.8 are grown by a chemical transportation method using iodine ($I_2$) as transporting medium for investigating fluorescence wavelength dependence upon x which is the mixture rate of ZnS in $ZnS_xSe_{1-x}$ crystals. The ZnSSe crystal bulks are not heat-treated. ZnSSe wafers of a 200 μm thickness are cut from the untreated bulks.

Both surfaces are mirror-polished. Mirror ZnSSe wafers of a 100 μm thickness are obtained. The untreated sample mirror ZnSSe wafers are irradiated with 450 nm blue light emitted from an InGaN-LED. The sample ZnSSe wafers fluoresce. Main wavelengths of the broad spectra of the fluorescence are investigated as a function of x. Table 3 shows the main wavelengths Λq for the $ZnS_xSe_{1-x}$ plate samples of x=0, 0.1, 0.2, 0.3, 0.4, 0.5, 0.6, 0.7 and 0.8, which are irradiated by 450 nm blue light.

TABLE 3

Main fluorescence wavelengths Λq for the untreated $ZnS_xSe_{1-x}$
plate samples of x = 0, 0.1, 0.2, 0.3, 0.4, 0.5, 0.6, 0.7 and 0.8,
which are irradiated by 450 nm blue light

| x(ZnS ratio) | Main fluorescence wavelength Λq |
|---|---|
| 0 | not fluoresce |
| 0.1 | 582 nm |
| 0.2 | 580 nm |
| 0.3 | 578 nm |
| 0.4 | 576 nm |

TABLE 3-continued

Main fluorescence wavelengths Λ q for the untreated $ZnS_xSe_{1-x}$ plate samples of x = 0, 0.1, 0.2, 0.3, 0.4, 0.5, 0.6, 0.7 and 0.8, which are irradiated by 450 nm blue light

| x(ZnS ratio) | Main fluorescence wavelength Λ q |
|---|---|
| 0.5 | 572 nm |
| 0.6 | 568 nm |
| 0.7 | 560 nm |
| 0.8 | 550 nm |

The predetermined range of the main fluorescence wavelength is from 568 nm to 580 nm. A suitable range of the ZnS rate x is from x=0.2 (580 nm) to x=0.6 (568 nm). Untreated ZnSe of x=0 does not fluoresce.

A $ZnS_{0.4}Se_{0.6}$ sample of x=0.4 is chosen from the untreated $ZnS_xSe_{1-x}$ crystal balks of x=0, 0.1, 0.2, 0.3, 0.4, 0.5, 0.6, 0.7 and 0.8. An untreated mirror (100) $ZnS_{0.4}Se_{0.6}$ plate of a 300 μm square and a 100 μm thickness is produced by cutting the $ZnS_{0.4}Se_{0.6}$ bulk in a 200 μm thickness, mirror-polishing both surfaces, scribing the wafer and dividing the wafer into square plates.

On-sapphire InGaN-LED chips 47 with an emission wavelength 450 nm are prepared. The LED chips 47 are fitted upside down to a bottom of the cavity 46 of the leadpin 44 with a sapphire substrate upward as shown in FIG. 10. Electrode pads on the bottom of the chip 47 are directly joined to the leadpins 44 and 45. The untreated $ZnS_{0.4}Se_{0.6}$ fluorescence plate 48 is glued to the sapphire substrate of the LED 47 with a transparent resin adhesive. A transparent resin 49 dispersed with scattering material powder (SiC) is filled to the cavity 46 for covering the InGaN-LED chip 47 and the $ZnS_{0.4}Se_{0.6}$ fluorescence plate 48. Top parts of the pins 44 and 45 are molded with a transparent resin 56 into a dome-shaped device. When the white color light emitting device is supplied with current, the device emits white color light of a color temperature of 4000K. The experiment teaches us that untreated $ZnS_xSe_{1-x}$ of $0.2 \leq x \leq 0.6$ can produce white light by cooperating with a blue light InGaN-LED.

[Embodiment 6 Blue Light Type (R); x=0.4, $\mu_{LED}$=420 nm, Λq=576 nm)]

A $ZnS_{0.4}Se_{0.6}$ (x=0.4) crystal bulk is grown by a chemical transportation method. A (100) $ZnS_{0.4}Se_{0.6}$ wafer of a 200 μm thickness is cut from the crystal bulk. The ZnSSe crystal wafer is not heat-treated. The ZnSSe wafers are mirror-polished on both surfaces into a 100 μm thickness. The untreated mirror ZnSSe wafer is scribed and cut into 300 μm square plates of a 100 μm thickness.

A 420 nm blue light emitting InGaN-LED chip is prepared. The LED chip is mounted in a flip-chip mode and glued on a bottom of a leadpin with a transparent resin, as shown in FIG. 10. The ZnSSe fluorescence plate 48 is glued on the sapphire substrate of the LED. A transparent resin 49 dispersed with a scattering material (SiC powder) is filled in the cavity 46 of the leadpin 44. A dome-shaped white color light source(R) is made by transfermolding the leadpins, wirings and leadpins with a resin in a metallic die. When electric current is supplied to the LED of the device (R), the InGaN-LED 47 emits blue light and the fluorescence plate 48 produces yellow light. The white made by mixing the blue and the yellow has a color temperature of 5000K.

I claim:

1. A white color light emitting device comprising:
   a light emitting diode (LED) emitting blue light between 410 nm and 470 nm; and
   a fluorescent material of $ZnS_xSe_{1-x}$ doped with more than $1 \times 10^{17}$ cm$^{-3}$ Al, In, Ga, Cl, Br or I for converting the blue light into yellow light between 568 nm and 580 nm and synthesizing white color light by mixing the 410 nm–470 nm blue light with the 568 nm–580 nm yellow light; wherein the $ZnS_xSe_{1-x}$ of the fluorescent material is heat-treated in a Zn atmosphere and the ZnS ratio x of the $ZnS_xSe_{1-x}$ satisfies an inequality $0.3 \leq x \leq 0.67$.

2. A white color light emitting device comprising:
   a light emitting diode (LED) emitting blue light between 410 nm and 470 nm; and
   a fluorescent material of $ZnS_xSe_{1-x}$ doped with more than $1 \times 10^{17}$ cm$^{-3}$ Al, In, Ga, Cl, Br or I for converting the blue light into yellow light between 568 nm and 580 nm and synthesizing white color light by mixing the 410 nm–470 nm blue light with the 568 nm–580 nm yellow light; wherein the $ZnS_xSe_{1-x}$ of the fluorescent material is not heat-treated and the ZnS ratio x of the $ZnS_xSe_{1-x}$ satisfies an inequality $0.2 \leq x \leq 0.6$.

3. A white color light emitting device comprising:
   a light emitting diode (LED) emitting blue light between 410 nm and 470 nm; and
   a fluorescent plate of $ZnS_xSe_{1-x}$ doped with more than $1 \times 10^{17}$ cm$^{-3}$ Al, In, Ga, Cl, Br or I for converting the blue light into yellow light between 568 nm and 580 nm and synthesizing white color light by mixing the 410 nm–470 nm blue light with the 568 nm–580 nm yellow light: wherein the $ZnS_xSe_{1-x}$ of the fluorescent plate is a polycrystal with an average grain size larger than a thickness of the fluorescent plate.

4. A white color light emitting device comprising:
   a light emitting diode (LED) emitting blue light between 410 nm and 470 nm; and
   a fluorescent material of $ZnS_xSe_{1-x}$ doped with more than $1 \times 10^{17}$ cm$^{-3}$ Al, In, Ga, Cl, Br or I for converting the blue light into yellow light between 568 nm and 580 nm and synthesizing white color light by mixing the 410 nm–470 nm blue light with the 568 nm–580 nm yellow light; wherein a wavelength $\lambda_{LED}$ of the blue light emitted by the LED satisfies an inequality of $\lambda_{LED} \leq 1239/(2.65+1.63x-0.63x^2)$, where x is a ZnS mixture rate of the $ZnS_xSe_{1-x}$ of the fluorescent material.

* * * * *

UNITED STATES PATENT AND TRADEMARK OFFICE
CERTIFICATE OF CORRECTION

| | | |
|---|---|---|
| PATENT NO. | : 7,129,526 B2 | Page 1 of 1 |
| APPLICATION NO. | : 11/018740 | |
| DATED | : October 31, 2006 | |
| INVENTOR(S) | : Shinsuke Fujiwara | |

It is certified that error appears in the above-identified patent and that said Letters Patent is hereby corrected as shown below:

On Title page

Item (30) Foreign Application Priority Data, "JP 2003-420030" should be --JP 2003-042030--;

Signed and Sealed this

Tenth Day of April, 2007

JON W. DUDAS
*Director of the United States Patent and Trademark Office*